(12) United States Patent
Shin et al.

(10) Patent No.: US 9,958,739 B2
(45) Date of Patent: May 1, 2018

(54) LIQUID CRYSTAL DISPLAY DEVICE

(71) Applicant: Samsung Display Co., Ltd., Yongin (KR)

(72) Inventors: Cheol Shin, Hwaseong-si (KR); Hak Sun Chang, Yongin-si (KR); Jang Wi Ryu, Seoul (KR); Jae-Soo Jang, Suwon-si (KR); Ki Chul Shin, Seongnam-si (KR); Seong Young Lee, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days. days.

(21) Appl. No.: 15/414,209

(22) Filed: Jan. 24, 2017

(65) Prior Publication Data

US 2017/0131602 A1 May 11, 2017

Related U.S. Application Data

(62) Division of application No. 14/491,403, filed on Sep. 19, 2014, now Pat. No. 9,588,381.

(30) Foreign Application Priority Data

Nov. 26, 2013 (KR) ........................ 10-2013-0144856

(51) Int. Cl.
*G02F 1/1343* (2006.01)
*G02F 1/1362* (2006.01)
(Continued)

(52) U.S. Cl.
CPC ...... *G02F 1/134336* (2013.01); *G02F 1/1368* (2013.01); *G02F 1/13439* (2013.01); *G02F 1/133345* (2013.01); *G02F 1/133707* (2013.01); *G02F 1/136286* (2013.01); *H01L 29/42384* (2013.01); *G02F 1/13624* (2013.01); *G02F 1/133753* (2013.01);
(Continued)

(58) Field of Classification Search
CPC .......... G02F 1/134309; G02F 1/13624; G02F 1/133707; G02F 1/136286; G02F 2001/134318; G02F 2001/134345; G02F 2203/30

See application file for complete search history.

(56) References Cited

U.S. PATENT DOCUMENTS

| 7,982,702 B2 | 7/2011 | Kamada et al. |
| 9,588,381 B2 * | 3/2017 | Shin ................. G02F 1/134309 |

(Continued)

FOREIGN PATENT DOCUMENTS

| JP | 2006154080 A | 6/2006 |
| JP | 4338511 B2 | 7/2009 |
| KR | 1020140113035 | 9/2014 |

*Primary Examiner* — Dung Nguyen
(74) *Attorney, Agent, or Firm* — Cantor Colburn LLP

(57) ABSTRACT

A liquid crystal display includes an insulation substrate, a plurality of pixels disposed on the insulation substrate, where each pixel has a shape elongated in a horizontal direction, and includes a thin film transistor formation region and a display area; and a reference voltage line extending in a vertical direction along a center of the display area, where the display area includes a single high-gray subpixel area and two low-gray subpixel areas, and the single high-gray subpixel area is positioned between the two low-gray subpixel areas.

8 Claims, 28 Drawing Sheets

(51) Int. Cl.
  *G02F 1/1333*   (2006.01)
  *G02F 1/1368*   (2006.01)
  *G02F 1/1337*   (2006.01)
  *H01L 29/423*   (2006.01)
  *H01L 27/12*   (2006.01)
  *G09G 3/36*   (2006.01)
  *G09G 3/20*   (2006.01)

(52) U.S. Cl.
  CPC ............ *G02F 2001/133742* (2013.01); *G02F 2001/134345* (2013.01); *G02F 2201/121* (2013.01); *G02F 2201/123* (2013.01); *G02F 2201/40* (2013.01); *G02F 2203/30* (2013.01); *G09G 3/2074* (2013.01); *G09G 3/3677* (2013.01); *G09G 3/3688* (2013.01); *G09G 2300/0426* (2013.01); *G09G 2300/0465* (2013.01); *H01L 27/124* (2013.01)

(56)     References Cited

U.S. PATENT DOCUMENTS

| | | |
|---|---|---|
| 2006/0033853 A1 | 2/2006 | Lee et al. |
| 2009/0009708 A1 | 1/2009 | Higa et al. |
| 2011/0037932 A1 | 2/2011 | Takahashi |
| 2012/0194774 A1 | 8/2012 | Jung et al. |
| 2015/0243240 A1 | 8/2015 | Ryu et al. |
| 2016/0246089 A1 | 8/2016 | Jeong et al. |

\* cited by examiner

195

195'

FIG. 19
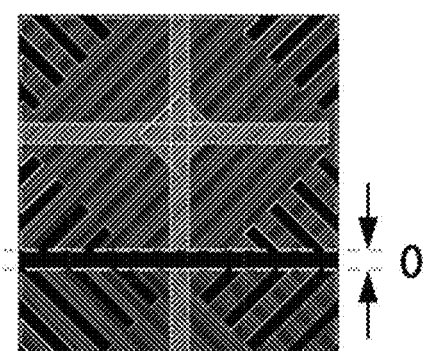
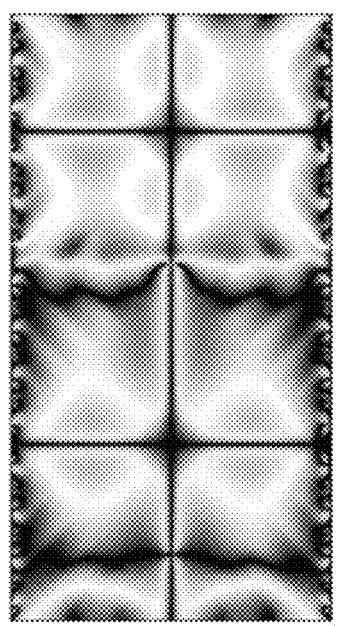

LIQUID CRYSTAL DISPLAY DEVICE

This application is a divisional of U.S. patent application Ser. No. 14/491,403, filed on Sep. 19, 2014, which claims priority to Korean Patent Application No. 10-2013-0144856 filed on Nov. 26, 2013, and all the benefits accruing therefrom under 35 U.S.C. § 119, the contents of which are incorporated by reference herein in its entirety.

BACKGROUND (a) Field

Exemplary embodiments of the invention relate to a liquid crystal display.

(b) Description of the Related Art

A liquid crystal display ("LCD") is one of the most widely used types of flat panel displays. The LCD typically includes two display panels, in which field generating electrodes such as pixel electrodes and common electrodes are provided, and a liquid crystal layer interposed between the two display panels. In such an LCD, a voltage is applied to the field generating electrodes to generate an electric field in the liquid crystal layer, which determines the direction of liquid crystal molecules of the liquid crystal layer, and an image is displayed by controlling the polarization of incident light.

Among the LCDs, a vertical alignment ("VA") mode LCD, in which longitudinal axes of liquid crystal molecules are aligned perpendicular to the panels in the absence of an electric field, has been developed.

In the VA mode LCD, a wide viewing angle may be realized by forming cutouts such as minute slits in the field-generating electrodes. Since the cutouts and protrusions may determine the tilt directions of the liquid crystal molecules, the tilt directions may be distributed in various directions using the cutouts and protrusions such that the reference viewing angle is widened.

SUMMARY

In a vertical alignment mode liquid crystal display, where the minute slits are defined in the pixel electrode including a plurality of branch electrodes, the response speed of liquid crystal molecules may be deteriorated due a relationship with other liquid crystal control forces of the liquid crystal molecule as well as the minute slits, such that a texture may be displayed over time.

Exemplary embodiments of the invention provide a liquid crystal display with reduced deterioration of display quality due to texture while minimizing a reduction of an aperture ratio. The invention also provides a liquid crystal display in which a vertical line stain is not generated.

An exemplary embodiment of a liquid crystal display according to the invention includes: an insulation substrate; a plurality of pixels disposed on an insulation substrate, where each pixel has a shape elongated in a horizontal direction, and includes a thin film transistor formation region and a display area; and a reference voltage line extending in a vertical direction along a center of the display area, where the display area includes a single high-gray subpixel area and two low-gray subpixel areas, and the single high-gray subpixel area is positioned between the two low-gray subpixel areas.

In an exemplary embodiment, the liquid crystal display may further include a first thin film transistor connected to a high-gray pixel electrode disposed in the single high-gray subpixel area, a second thin film transistor connected to two low-gray pixel electrodes disposed in the two low-gray subpixel areas, respectively, and a third thin film transistor connected to the two low-gray pixel electrodes and the reference voltage line.

In an exemplary embodiment, the reference voltage line may include a branch extending toward the thin film transistor formation region along an outer region of the display area.

In an exemplary embodiment, each of the single high-gray subpixel area and the two low-gray subpixel areas may include four domains.

In an exemplary embodiment, the reference voltage line may cross a center of the single high-gray subpixel area.

In an exemplary embodiment, the display area may include eight domains.

In an exemplary embodiment, the single high-gray subpixel area may include four domains, and each of the two low-gray subpixel areas may include two domains.

In an exemplary embodiment, the single high-gray subpixel area may include three domains, one of the two low-gray subpixel areas may include three domains, and the other of the two low-gray subpixel areas may include two domains.

In an exemplary embodiment, the eight domains of the display area may be arranged in two rows extending in the horizontal direction and four columns extending in the vertical direction in the display area, and the single high-gray subpixel area may include a domain disposed in a second column and a second row, a domain disposed in a third column and a first row, and a domain disposed in the third column and the second row.

In an exemplary embodiment, the liquid crystal display may further include a first connection disposed along an upper region of the display area, wherein the first connection connects the single high-gray pixel electrode and the first thin film transistor to each other, and a second connection disposed along the upper region of the display area, wherein the third connection connects one of the two low-gray pixel electrodes and the second thin film transistor.

In an exemplary embodiment, each of the first connection and the second connection may include a bent end portion bent from an extending direction thereof toward the display area, and a length of the bent end portion of each of the first connection and the second connection may be in a range of about 6 micrometers (μm) to about 8 μm.

In an exemplary embodiment, each of the single high-gray pixel electrode and the two low-gray pixel electrodes may include a plurality of unit pixel electrodes, each unit pixel electrode may include a center electrode having a plane shape and a plurality of minute branches extending from a side of the center electrode, each of the single high-gray subpixel area and the two low-gray subpixel areas may include a common electrode facing the unit pixel electrodes thereof, and an opening may be defined in the common electrode.

An exemplary embodiment of a liquid crystal display according to the invention includes: an insulation substrate; a plurality of pixels disposed on the insulation substrate, where each pixel has a shape elongated in a horizontal direction, and includes a thin film transistor formation region and a display area; and a reference voltage line extending in a vertical direction along a center of the display area, where the display area includes a plurality of domains arranged in two rows, one row domain among two row domains is the high-gray subpixel area, the domains in a first row of the two rows define a high-gray subpixel area of the display area, the domains in a second row of the two rows define a low-gray subpixel area of the display area, and the reference voltage line includes a branch extending toward the thin film transistor formation region along an outer region of the display area.

In an exemplary embodiment, the liquid crystal display may further include a first thin film transistor connected to a high-gray pixel electrode disposed in the high-gray subpixel area, a second thin film transistor connected to a low-gray pixel electrode disposed in the low-gray subpixel area, and a third thin film transistor connected to the low-gray pixel electrode and the reference voltage line.

In an exemplary embodiment, each of the high-gray subpixel area and the low-gray subpixel area may include six domains.

In an exemplary embodiment, the reference voltage line may cross a center of the high-gray subpixel area and the low-gray subpixel area.

In an exemplary embodiment, the high-gray pixel electrode may include a plurality of unit pixel electrodes corresponding to the domains in the high-gray pixel area, the low-gray pixel electrode may include a plurality of unit pixel electrodes corresponding to the domains in the low-gray pixel area, one of the unit pixel electrodes of the high-gray pixel electrode in the high-gray subpixel area and one of the unit pixel electrodes of the low-gray pixel electrode in the low-gray subpixel area may be disposed adjacent to each other in the vertical direction, and a distance between the unit pixel electrodes disposed adjacent to each other in the vertical direction may be uniform.

In an exemplary embodiment, the high-gray pixel electrode may include a plurality of unit pixel electrodes corresponding to the domains in the high-gray pixel area, the low-gray pixel electrode may include a plurality of unit pixel electrodes corresponding to the domains in the low-gray pixel area, one of the unit pixel electrodes of the high-gray pixel electrode in the high-gray subpixel area and one of the unit pixel electrodes of the low-gray pixel electrode in the low-gray subpixel area may be disposed adjacent to each other in the vertical direction, and a distance between the unit pixel electrodes disposed adjacent to each other in the vertical direction may increase in a direction away from the center of the display area toward a side of the display area.

In an exemplary embodiment, a difference between the distance between the unit pixel electrodes disposed adjacent to each other in the vertical direction at the center of the display area and the distance between the unit pixel electrodes disposed adjacent to each other in the vertical direction at the side of the display area may be in a range of about zero (0) µm to about 3 µm.

In an exemplary embodiment, each of the high-gray pixel electrode and the low-gray pixel electrode may include a plurality of unit pixel electrodes, each of the unit pixel electrodes may include a center electrode having a plane shape and a plurality of minute branches extending from a side of the center electrode, each of the high-gray subpixel area and the low-gray subpixel area may include a common electrode facing the unit pixel electrodes thereof, and an opening may be defined in the common electrode.

As described above, in exemplary embodiments of the liquid crystal display including the pixel having an elongated shape in the horizontal direction, the texture and the portion to be covered by the light blocking member may be minimized, thereby improving the aperture ratio. In such embodiments, by forming the right-left symmetry of the pixel that is elongated in the horizontal direction, an occurrence of a vertical line stain is effectively prevented.

BRIEF DESCRIPTION OF THE DRAWINGS

The above and other features of the invention will become more apparent by describing in detailed exemplary embodiments thereof with reference to the accompanying drawings, in which:

FIG. 19 to FIG. 22 are views of texture of exemplary embodiments of a pixel electrode having various structures, according to the invention;

DETAILED DESCRIPTION

Figure 1:
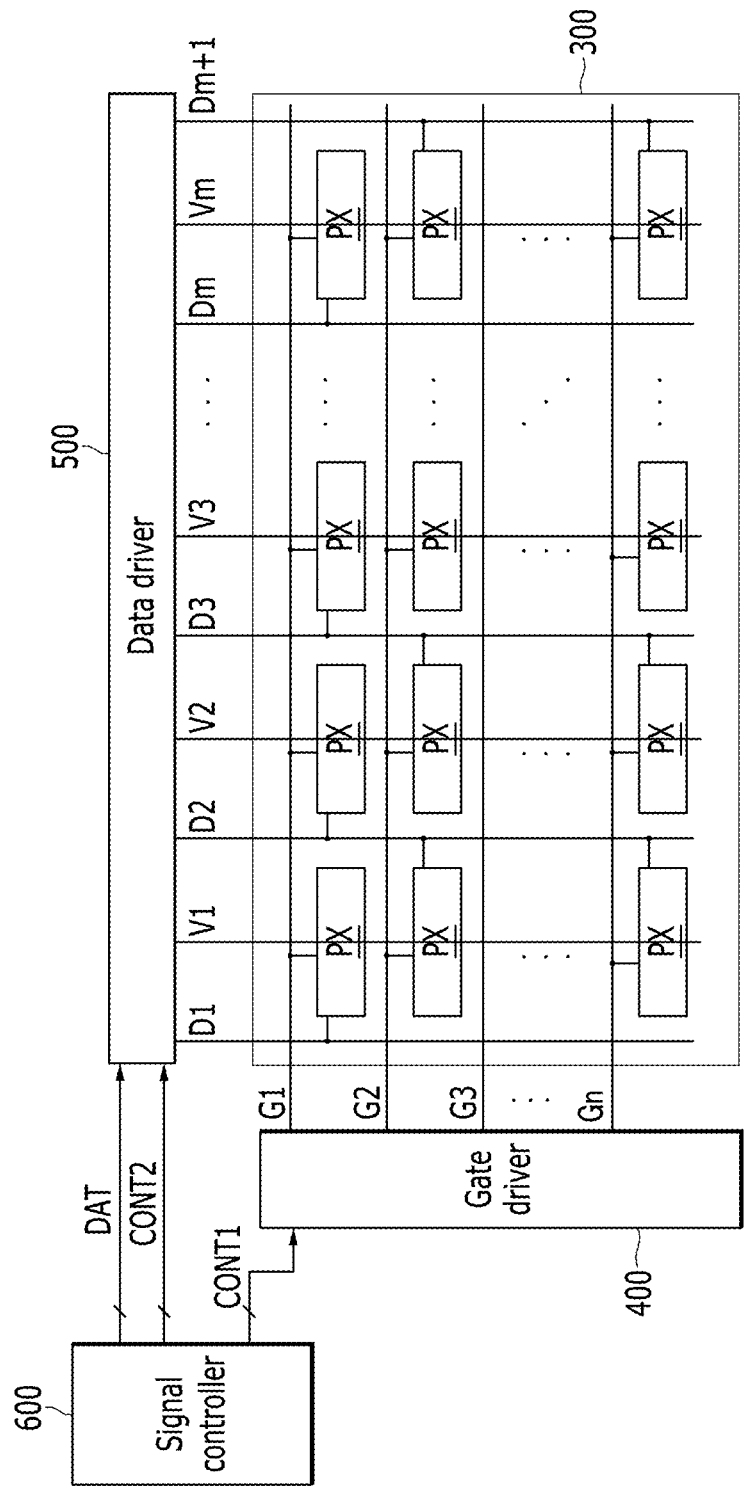
FIG. 1 is a block diagram showing an exemplary embodiment of a display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Now, an exemplary embodiment of a display device according to the invention will be described with reference to FIG. 1.

FIG. 1 is a block diagram showing an exemplary embodiment of a display device according to the invention.

As shown in FIG. 1, an exemplary embodiment of a display device, according to the invention, includes a display panel 300 for displaying an image, a data driver 500 and a gate driver 400 for driving the display panel 300, and a signal controller 600 for controlling the data driver 500 and the gate driver 400.

The display panel 300 includes a plurality of gate lines G1 to Gn and a plurality of data lines D1 to D(m+1). The plurality of gate lines G1 to Gn extend substantially in a transverse direction, and the plurality of data lines D1 to D(m+1) extends substantially in a longitudinal direction, thereby crossing the plurality of gate lines G1 to Gn. In such an embodiment, a plurality of reference voltage lines V1 to Vm extending substantially in the longitudinal direction are disposed between the plurality of data lines D1 to D(m+1). The reference voltage lines V1 to Vm cross the gate lines G1 to Gn.

Each pixel PX is connected to a corresponding gate line and a corresponding data line. The pixels PX are arranged substantially in a matrix form including a plurality of pixel rows and a plurality of pixel columns, and each pixel PX may be a transverse type pixel having a shape elongated substantially in the horizontal or the transverse direction that is an extension direction of the gate lines G1 to Gn. As described above, the transverse type pixel may include a thin film transistor, a liquid crystal capacitor, and storage capacitor. A control terminal of the thin film transistor is connected to the corresponding gate line of the gate lines G1 to Gn, an input terminal of the thin film transistor is connected to the corresponding data line of the data lines D1 to D(m+1), and an output terminal of the thin film transistor is connected to one terminal (a pixel electrode) of the liquid crystal capacitor and one terminal of a storage capacitor. The other terminal of the liquid crystal capacitor is connected to the common electrode, and the other terminal of the storage capacitor may be applied with a storage voltage. According to an exemplary embodiment, a channel layer of the thin film transistor may include or be made of amorphous silicon, polysilicon, or an oxide semiconductor, for example. The reference voltage lines V1 to Vm provide a reference voltage to the pixels PX. In an exemplary embodiment, the reference voltage has a constant level that is not changed according to time. In an alternative exemplary embodiment, the reference voltage may have a voltage level that changes according to time.

In an exemplary embodiment of the liquid crystal display according to the invention, a data line is alternately connected to left and right pixels PX. In such an embodiment, the data line is connected to the pixel PX positioned at the right side in the first row, is connected to the pixel PX positioned at the left side in the second row, and is connected to the pixels PX positioned at the right side in the third row. In an exemplary embodiment, a gate line is connected to all pixels PX of a pixel row corresponding thereto.

According to such an embodiment, the odd-numbered pixels and the even-numbered pixels in a pixel column are connected to different data lines, e.g., two adjacent data lines thereof. In such an embodiment, when each data line is applied with the data voltage of the same polarity during one frame, a polarity inversion displayed at the pixels PX may appear as a dot inversion.

A number of the data lines D1 to D(m+1) (e.g., m+1) may be greater than a number (m) of the pixel columns by one. In an exemplary embodiment, as shown in FIG. 1, the pixel column does not exist at the left side of the first data line D1 such that only the pixel column at the right side thereof is alternately connected to the first data line D1, and the pixel column does not exist at the right side such that the last data line, that is, the (m+1)-th data line D(m+1), may only be alternately connected to the pixel column at the left side thereof.

The signal controller 600 operates based on an operation condition of the liquid crystal display panel 300 in response to input data and a control signal from the outside, for example, a vertical synchronization signal, a horizontal synchronization signal, a main clock signal, and a data enable signal, and then generates and outputs image data DAT, a gate control signal CONT1, a data control signal CONT2, and a clock signal based on the input data and the control signal.

The gate control signal CONT1 may include a scanning start signal which instructs to start outputting the gate-on voltage, and a gate clock signal which controls an output timing of the gate-on voltage.

The data control signal CONT2 may include a horizontal synchronization start signal which instructs to start inputting the image data DAT, and a load signal which applies a data voltage to the data lines D1 to D(m+1).

The plurality of gate lines G1 to Gn of the display panel 300 are connected to the gate driver 400, and the gate driver 400 sequentially applies the gate-on voltage Von to the gate lines G1 to Gn based on the gate control signal CONT1 applied from the signal controller 600.

The gate-off voltage is applied during a section of a frame in which the gate-on voltage Von is not applied to the gate lines G1 to Gn.

The plurality of data lines D1 to D(m+1) of the display panel 300 are connected to the data driver 500, and the data driver 500 receives the data control signal CONT2 and the image data DAT from the signal controller 600. The data driver 500 converts the image data DAT into the data voltage using gray voltages generated in a gray voltage generator (not shown) and transmits the data voltage to the data lines D1 to D(m+1). The data voltage includes a data voltage of a positive polarity and a data voltage of a negative polarity. The data voltage of the positive polarity and the data voltage of the negative polarity are alternately applied with reference to a frame, the pixel row, or the pixel column to be driven by the inversion method. The inversion driving may be performed to display a motion picture or a still image.

According to an exemplary embodiment, various pixel connection structures that are not shown in FIG. 1 may be provided.

Next, a structure of one pixel PX will be schematically described with reference to FIG. 2.

Figure 2:
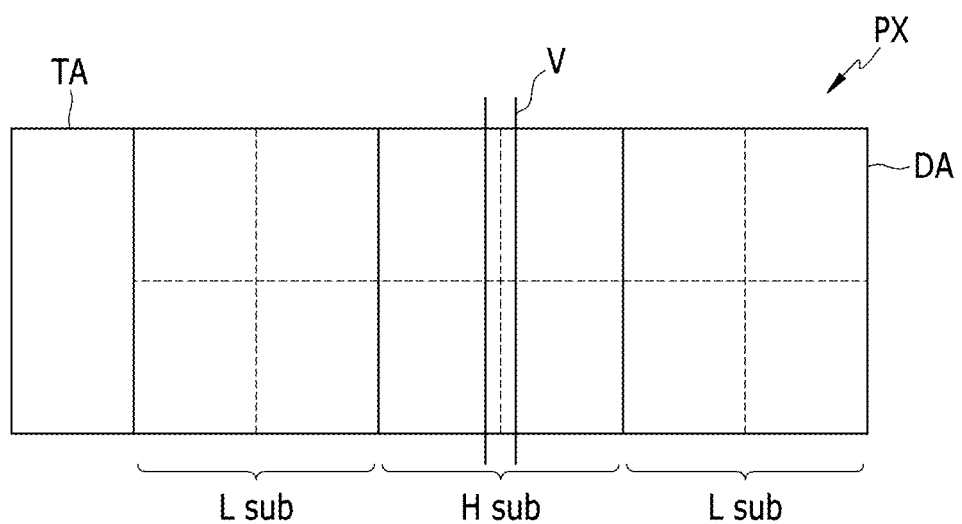
FIG. 2 is a schematic diagram showing an exemplary embodiment of a pixel of a display device according to the invention.

FIG. 2 is a schematic diagram showing a pixel of an exemplary embodiment of a display device according to the invention.

According to an exemplary embodiment of the invention, a pixel PX of the display device is a transverse type pixel having a shape elongated substantially in the horizontal direction. In such an embodiment, the pixel PX includes a thin film transistor formation region TA and a display area DA. The pixel electrode of the pixel is disposed in the display area DA, and the image is displayed through liquid crystal molecules disposed in the display area DA. The thin film transistor formation region TA includes an element and wiring such as a thin film transistor for transmitting a voltage to be applied to the pixel electrode of the display area DA.

In an exemplary embodiment, as shown in FIG. 2, a reference voltage line V is disposed in the longitudinal direction along an imaginary vertical center line of the display area DA in the pixel PX. In such an embodiment, the display area DA is largely divided into three subpixel areas, e.g., one or single high-gray subpixel area H sub and two low-gray subpixel areas L sub. The high-gray subpixel area H sub is positioned at a center portion of the pixel PX and the two low-gray subpixel areas L sub are positioned at respective sides of the one high-gray subpixel area H sub, as shown in FIG. 2. In such an embodiment, the reference voltage line V passes through the center of the high-gray subpixel area H sub in the longitudinal direction.

In an exemplary embodiment, each of the subpixel areas H sub and L sub include four domains, as shown by dotted lines in FIG. 2. In such an embodiment, each subpixel area is divided into four domains by lines intersecting the center in a transverse direction and a longitudinal direction. Accordingly, in such an embodiment, the pixel PX includes twelve domains. In such an embodiment, the reference voltage line V is positioned while dividing twelve the domains in half, and four domains of the low-gray subpixel area L sub and two domains of the high-gray subpixel area H sub are positioned at each of the left and right sides of the reference voltage line V. Accordingly, in such an embodiment, the left part and the right part of the display area DA with reference to the reference voltage line V display images substantially symmetrical to each other. In an exemplary embodiment, where the pixel displays an image of the left and right symmetry with reference to the reference voltage line V, the plurality of pixels PX may output an image as shown in FIG. 3.

Figure 3:
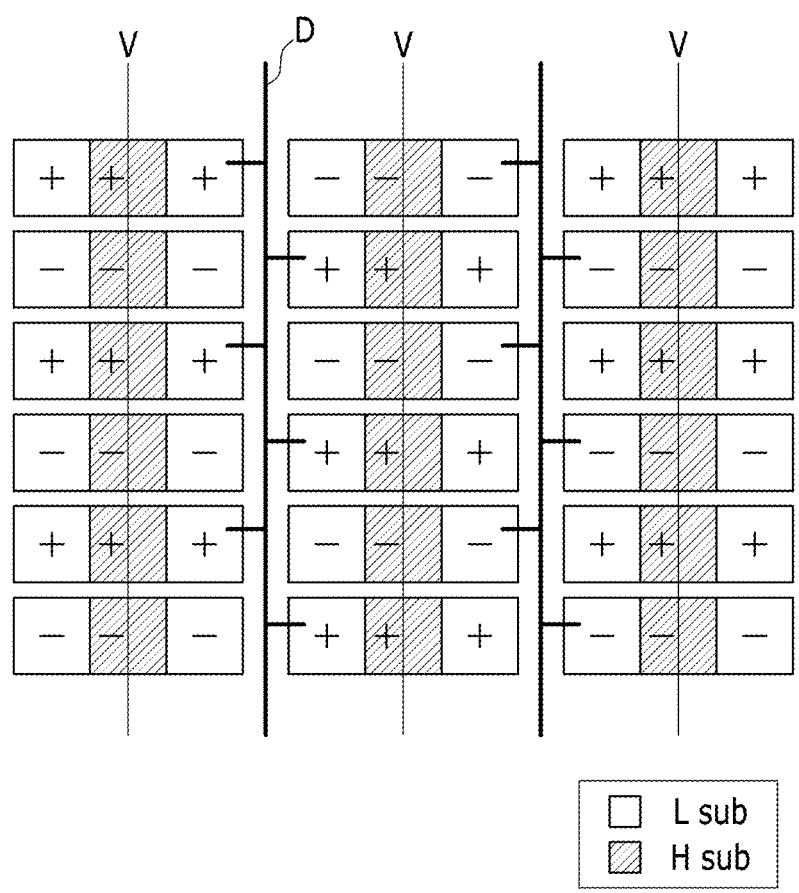
FIG. 3 is a view showing a connection relationship of pixels of an exemplary embodiment of a display device, according to the invention.

FIG. 3 is a view showing a connection relationship of pixels of an exemplary embodiment of a display device according to the invention.

FIG. 3 shows a structure in which each pixel PX outputs an image with left-right or mirror symmetry with reference to the reference voltage line V corresponding thereto, and the adjacent pixels PX have different polarities. In FIG. 3, D refers to the data line.

In an exemplary embodiment, as shown in FIG. 3, each pixel PX is right-left symmetrical, and the adjacent pixels PX are applied with the data voltages of different polarities. Accordingly, in such an embodiment, although the high-gray subpixels are disposed along a same subpixel column and the low-gray subpixels are disposed along a same subpixel column, a luminance difference may not occur and a vertical line stain is not recognized by a viewer.

In an exemplary embodiment, the reference voltage line V crosses the center of the pixel PX such that a portion of the high-gray subpixel overlaps, e.g., is covered by, the reference voltage line V. However, in such an embodiment, the higher luminance higher than the low-gray subpixel is displayed by the high-gray subpixel such that the luminance deterioration due to the reference voltage line V is substantially small and a reduction of the aperture ratio is decreased. In such an embodiment, the reference voltage line V divides the display luminance to be substantially constant on the right and left of the pixel PX such that the display quality may be substantially constantly maintained at the right and left of the pixel PX.

Next, a structure of the pixel electrode and the reference voltage line V in the pixel PX will be described with reference to FIG. 4.

Figure 4:
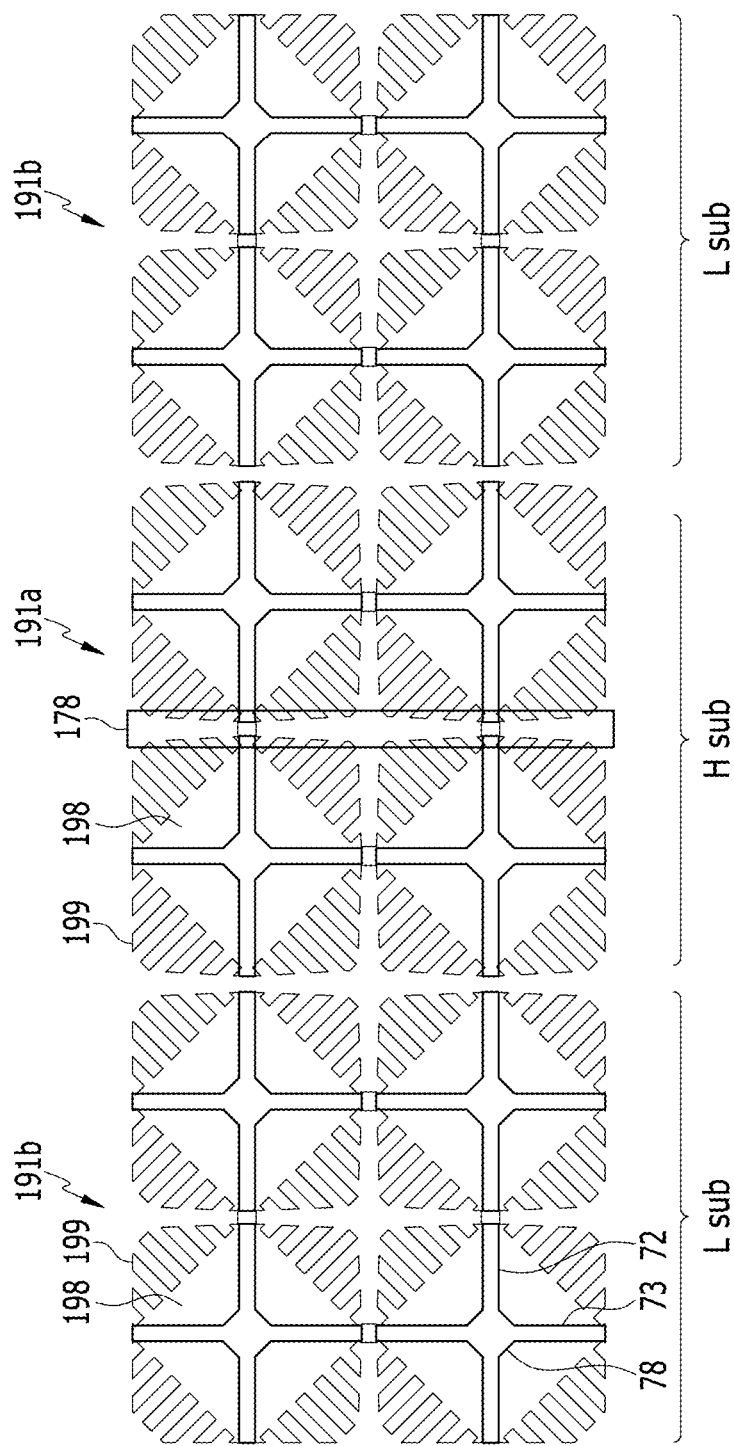
FIG. 4 is a plan view of a pixel electrode and surroundings thereof in an exemplary embodiment of a display device according to the invention.

FIG. 4 is a plan view of a pixel electrode and surroundings thereof in an exemplary embodiment of a display device according to the invention.

The pixel electrode in a pixel PX includes a high-gray pixel electrode 191a as the pixel electrode of the high-gray subpixel and a low-gray pixel electrode 191b as the pixel electrode of the low-gray subpixel.

Each of the high-gray pixel electrode 191a and the low-gray pixel electrode 191b includes four unit pixel electrodes 198 and 199 corresponding to four domains, respectively, and each unit pixel electrode includes a center electrode 198 and a plurality of minute branches 199 extending outside from a side of the center electrode 198. The plurality of minute branches 199 may form an angle of about 45 degrees with respect to a horizontal direction or a vertical direction, or may form an angle in a range of about 40 degrees to about 50 degrees with respect to the horizontal direction or the vertical direction. Also, one side of the center electrode 198 and the minute branches 199 may be vertical to each other.

Four unit pixel electrodes of the high-gray pixel electrode 191a and four unit pixel electrodes the low-gray pixel electrode 191b are connected to each other through an extension. In an exemplary embodiment, as shown in FIG. 4, the center electrode 198 has a size large enough to contact or to define a side of a region where the unit pixel electrode is disposed, but not being limited thereto. In an alternative exemplary embodiment, the size of the center electrode 198 may be decreased, and the minute branches 199 may be positioned at the corner of the center electrode 198 to contact or define the side of the region where the unit pixel electrode is disposed. The extension of the unit pixel electrode extends from the center electrode 198 or the minute branches 199. Four unit pixel electrodes connected by the extension are applied with a same voltage. The unit pixel electrodes in a same pixel electrode, e.g., the high-gray pixel electrode 191a or the low-gray pixel electrode 191b, are connected to each other through the extension, and are separated from the unit pixel electrodes included in another pixel electrode, e.g., the low-gray pixel electrode 191b or the high-gray pixel electrode 191a.

In an exemplary embodiment, openings 72, 73 and 78 are defined in an upper common electrode of one domain region where the unit pixel electrodes 198 and 199 are positioned as a domain divider. In such an embodiment, the openings in the upper common electrode may be a cross-shaped opening including a transverse opening 72 and a longitudinal opening 73 crossing the transverse opening 72, and a center opening 78 positioned at the center of the cross-shaped opening. The center opening 78 may have a polygonal shape including four straight sides respectively positioned at four subregions divided by the cross-shaped opening. In one exemplary embodiment, for example, the center opening 78 has a rhombus shape.

In an exemplary embodiment, the openings 72, 73 and 78 corresponding to the adjacent unit pixel electrodes are not connected to each other. In an alternative exemplary embodiment, the openings 72, 73 and 78 in the adjacent unit pixel electrodes may be connected to each other.

In the structure in which a low-gray pixel electrode 191b, a high-gray pixel electrode 191a and a low-gray pixel electrode 191b are sequentially arranged, the reference voltage line 178 crosses the center of the high-gray pixel electrode 191a positioned at the center of the pixel in the longitudinal direction.

The entire structure of the pixel including the pixel electrode, the common electrode and the reference voltage line described above will be described in greater detail with reference to FIG. 5.

Figure 5:
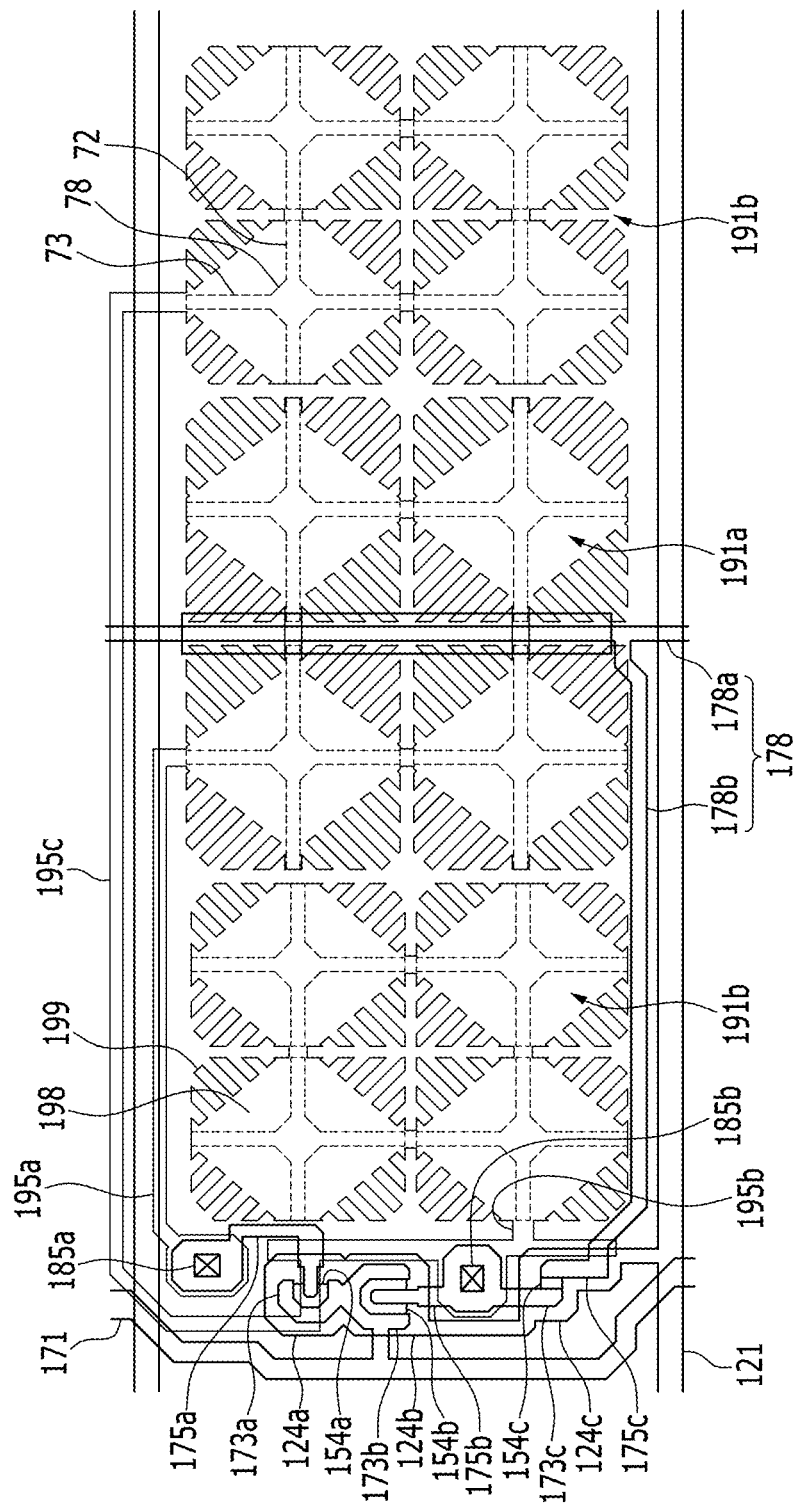
FIG. 5 is a view of a detailed structure of a pixel of FIG. 4.

FIG. 5 is a view of the detailed structure of the pixel of FIG. 4.

Firstly, in an exemplary embodiment of a display device, a plurality of gate lines 121 is disposed on an insulation substrate (not shown) of a lower panel thereof.

The gate lines 121 extend substantially in the transverse direction and include a first gate electrode 124a, a second gate electrode 124b and a third gate electrode 124c protruding and extending upwardly from the gate line 121. In such an embodiment, the third gate electrode 124c extends and expands upwardly from the gate line 121, and the first gate electrode 124a and the second gate electrode 124b extend from the third gate electrode 124c. The first gate electrode 124a and the second gate electrode 124b may be defined at a same expanded region from the third gate electrode 124c. In such an embodiment, the gate line 121 may include a curved portion that is periodically curved from a main line extending in the transverse direction.

A gate insulating layer is disposed on the gate line 121, and a first semiconductor 154a, a second semiconductor 154b and a third semiconductor 154c are disposed on the first gate electrode 124a, the second gate electrode 124b and the third gate electrode 124c, respectively.

A data conductor including a data line 171, a first drain electrode 175a, a second drain electrode 175b, a third source electrode 173c, a third drain electrode 175c and the reference voltage line 178 is disposed on the first semiconductor 154a, the second semiconductor 154b, third semiconductor 154c and the gate insulating layer.

The data line 171 extends substantially in the longitudinal direction and includes a first source electrode 173a and a second source electrode 173b respectively extending from a main line of the data line 171 toward the first and second gate electrodes 124a and 124b.

The reference voltage line 178 includes a main line 178a extending substantially parallel to the data line 171 and a branch 178b extending from the main line 178a and substantially parallel to the gate line 121. The branch 178b extends to a thin film transistor formation region TA along an outer region of the display area, and one end of the branch 178b defines the third drain electrode 175c.

In such an embodiment, the first drain electrode 175a faces the first source electrode 173a, the second drain electrode 175b faces the second source electrode 173b, and the third drain electrode 175c faces the third source electrode 173c. The third source electrode 173c is connected to the second drain electrode 175b.

The first gate electrode 124a, the first source electrode 173a and the first drain electrode 175a collectively define a first thin film transistor along with the first semiconductor 154a, the second gate electrode 124b, the second source electrode 173b and the second drain electrode 175b collectively define a second thin film transistor along with the second semiconductor 154b, and the third gate electrode 124c, the third source electrode 173c and the third drain electrode 175c collectively define a third thin film transistor along with the third semiconductor 154c. In such an embodiment, the data voltage is applied through the source electrode of the first thin film transistor and the second thin film transistor, and the reference voltage is applied through the source electrode of the third thin film transistor.

A passivation layer is disposed on the data conductor and a pixel electrode is disposed on the passivation layer.

In such an embodiment, each pixel electrode includes one high-gray pixel electrode 191a and two low-gray pixel electrodes 191b as shown in FIG. 4.

Figure 12:
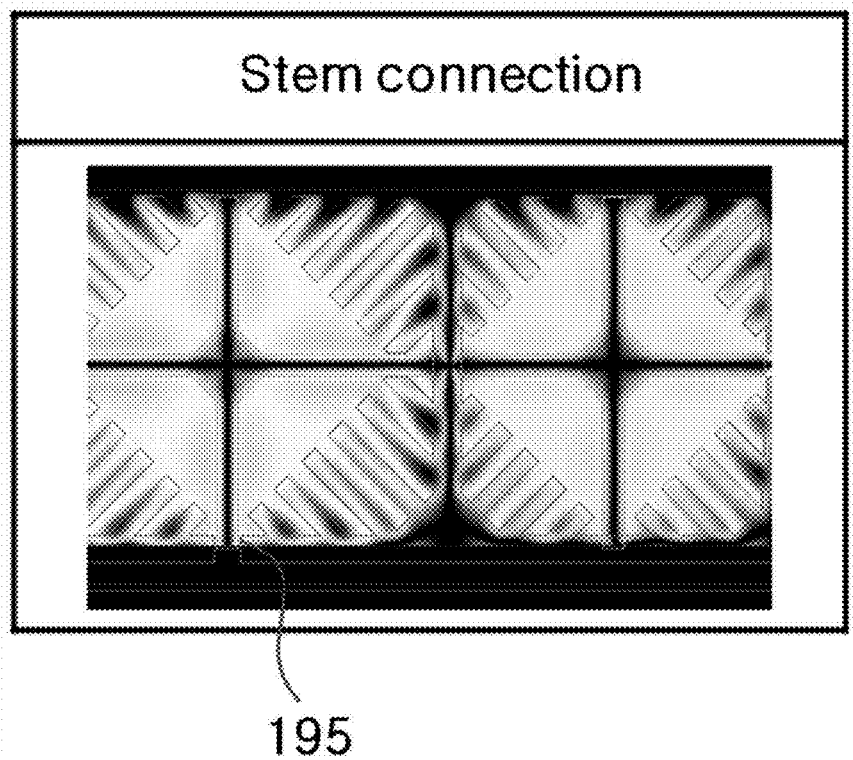
FIG. 12 to FIG. 14 are views of a connection structure of an exemplary embodiment of a pixel electrode according to the invention.
Figure 13:
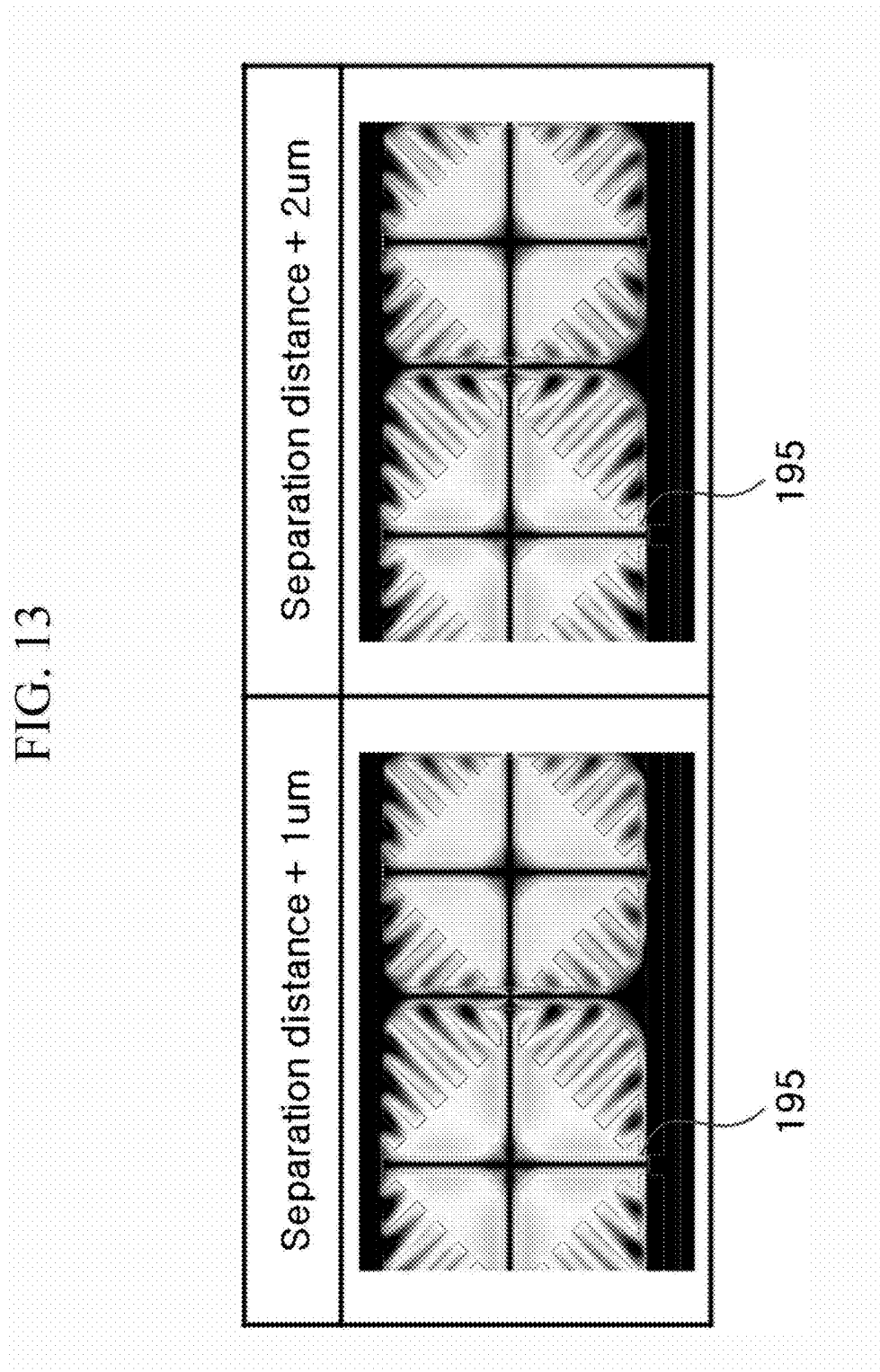
Figure 14:
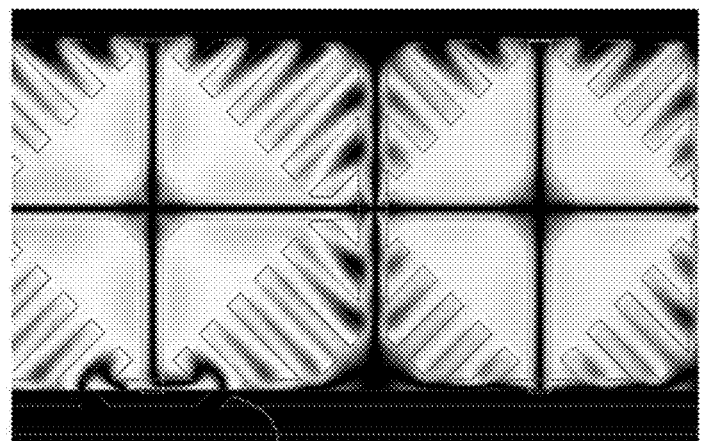

The first drain electrode 175a of the first thin film transistor is connected to the high-gray pixel electrode 191a through a first contact hole 185a. In an exemplary embodiment, as shown in FIG. 5, the first drain electrode 175a of the first thin film transistor is connected to the high-gray pixel electrode 191a through a first connection 195a disposed in an upper region of the pixel (the display area). The first connection 195a includes a bent end portion connected to one unit pixel electrode of the high-gray pixel electrode 191a. In an exemplary embodiment, the first connection 195a may have a linear structure, and is directly connected to the center electrode 198 of the high-gray pixel electrode 191a, as shown in FIG. 14. Referring to FIG. 12 and FIG. 13, in an alternative exemplary embodiment, where the first connection 195a include a bent end portion connected to one unit pixel electrode of the high-gray pixel electrode 191a, a length of the bent end portion of the first connection 195a bent toward the high-gray pixel electrode 191a may be in a range of about 6 micrometers (μm) to about 8 μm.

The second drain electrode 175b of the second thin film transistor is connected to two low-gray pixel electrodes 191b through a second connection 195b and a third connection 195c, respectively, via a second contact hole 185b. The center electrode 198 of the low-gray pixel electrode 191b closer to the second thin film transistor is connected to the second drain electrode 175b through the second connection 195b. The low-gray pixel electrode 191b far from the second thin film transistor is connected to the second drain electrode 175b through the third connection 195c disposed along the upper region of the pixel (the display area). In an exemplary embodiment, the third connection 195c includes a bent end portion connected to one unit pixel electrode of the low-gray pixel electrode 191b. In an alternative exemplary embodiment, the third connection 195c is not divided into two portions by bending but linearly extends to be connected to the center electrode 198 of the low-gray pixel electrode 191b as shown in FIG. 14. Referring to FIG. 12 and FIG. 13, in an exemplary embodiment, where the third connection 195c includes a bent end portion connected to one unit pixel electrode of the low-gray pixel electrode 191b, a length of the bent end portion of the third connection 195c bent toward the low-gray pixel electrode 191b may be in a range of about 6 μm to about 8 μm.

Next, a common electrode facing the pixel electrode and which receives a common voltage is disposed on an insulation substrate of an upper panel of the display device. In such an embodiment, the openings 72, 73 and 78 are defined in the common electrode, as shown in FIG. 4. According to an exemplary embodiment, the common electrode may include a protrusion as the domain divider.

In such an embodiment, the display device includes a liquid crystal layer interposed between the lower panel and the upper panel, and the liquid crystal layer includes liquid crystal molecules having negative dielectric anisotropy. The liquid crystal molecules may be aligned such that longitudinal axes thereof are substantially perpendicular to the two display panels when an electric field is not generated therein.

In such an embodiment, when the data voltage is transmitted to the pixel PX, the data voltage is applied as it is to the high-gray pixel electrode 191a through the first thin film transistor. In such an embodiment, the two low-gray pixel electrodes 191b are applied with a middle voltage between the data voltage applied through the second thin film transistor and the reference voltage applied through the third thin film transistor. As a result, the high-gray pixel electrode 191a and two low-gray pixel electrodes 191b are applied with the voltages of the different levels.

The high-gray and low-gray pixel electrodes 191a and 191b applied with the data voltages of the different levels generate an electric field along with a common electrode of the upper panel such that the orientation of the liquid crystal molecules of the liquid crystal layer between the two electrodes is determined. When the orientation of the liquid crystal molecules of the liquid crystal layer between the two electrodes is determined, the inclination direction of the liquid crystal molecules may be firstly determined by a horizontal component generated by a gap where the pixel electrode is not positioned and the side of the opening of the common electrode that distorts the main electric field substantially perpendicular to the surface of the display panel. The horizontal component of the main electric field is substantially perpendicular to the side of the unit pixel electrode and the opening, and the liquid crystal molecules are inclined in the direction substantially vertical to the sides thereof.

A portion where texture is generated in the pixel having the structure of FIG. 4 and FIG. 5 will be described with reference to FIG. 6.

Figure 6:
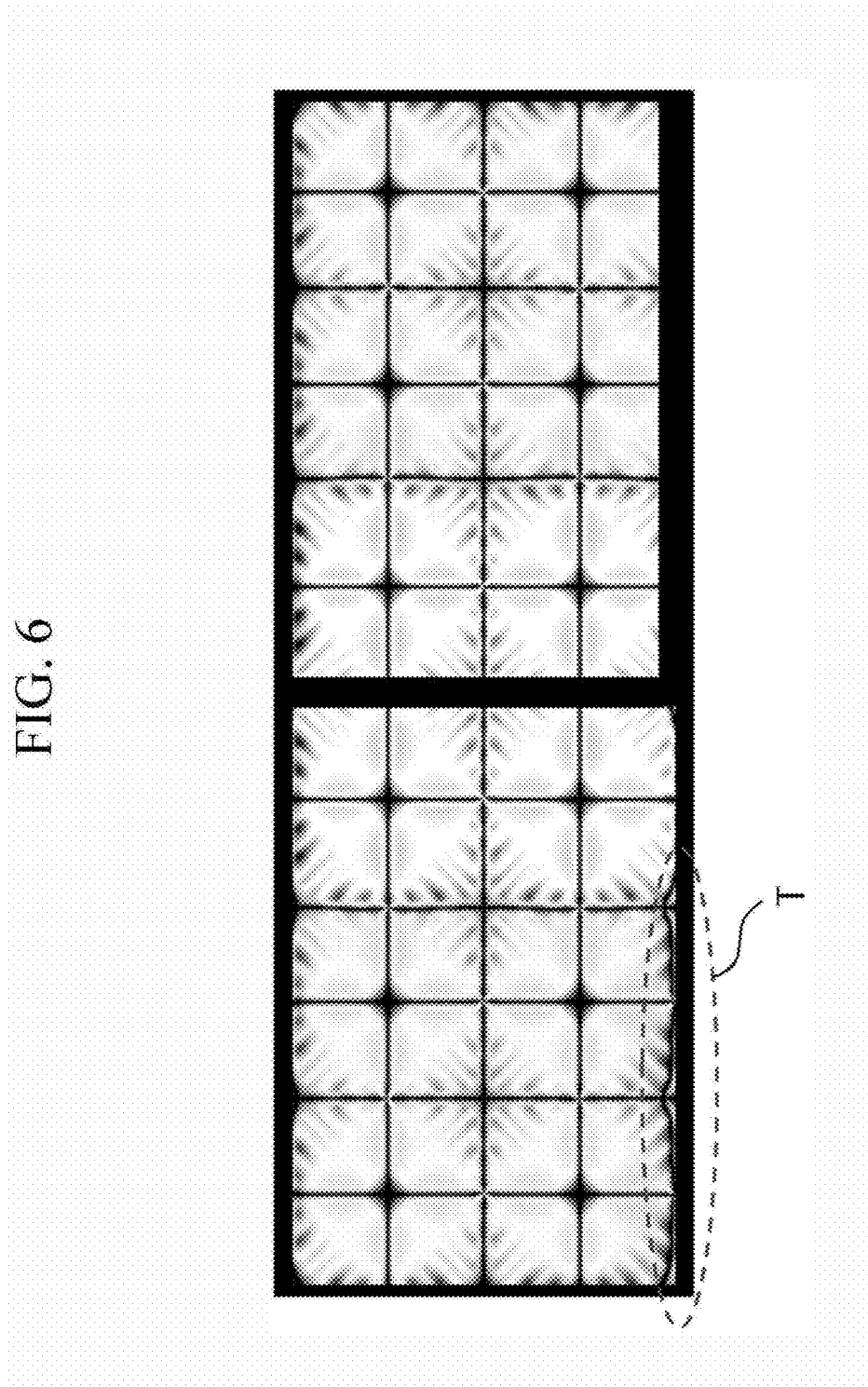
FIG. 6 is a view of texture of an exemplary embodiment of a pixel in a structure of FIG. 5.

FIG. 6 is a view showing texture of an exemplary embodiment of a pixel in a structure of FIG. 5.

In FIG. 6, the texture is shown in the portion indicated by T. This portion is below the low-gray pixel electrode 191b and above the branch 178b of the reference voltage line 178. In general, the texture mainly appears on the circumference (up/down/right/left) of the low-gray pixel electrode 191b. In the pixel structure of an exemplary embodiment of the invention, as shown in FIG. 6, the texture is only recognized under the low-gray pixel electrode 191b closer to the thin film transistor formation region TA among two low-gray pixel electrodes 191b such that the formation of the texture is reduced.

Exemplary embodiments, in which one display area DA is divided into twelve domains, are described above.

Next, exemplary embodiments in which one display area DA is divided into eight domains will be described with reference to FIG. 7 to FIG. 11.

Figure 7:
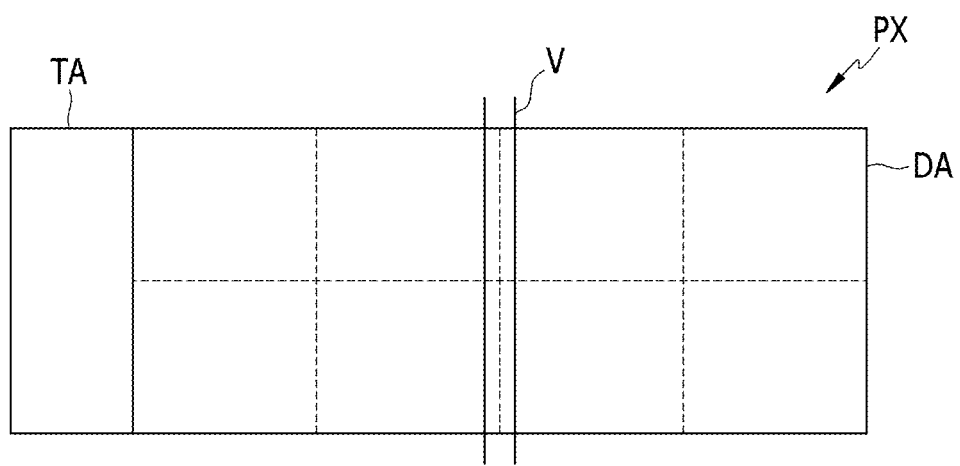
FIG. 7 is a schematic diagram showing another alternative exemplary embodiment of a pixel according to the invention.

FIG. 7 is a schematic diagram of a pixel of an alternative exemplary embodiment of a display device, according to the invention.

In an exemplary embodiment, a pixel PX is the transverse type pixel having a shape elongated substantially in the horizontal direction with a total of eight domains. The eight domains are arranged in the horizontal direction and the vertical direction with 2 rows and 4 columns.

In such an embodiment, the pixel PX generally includes the thin film transistor formation region TA and the display area DA. The pixel electrode is disposed in the display area DA, and the image is displayed through the liquid crystal molecules positioned at the display area DA. In such an embodiment, an element and wiring such as a thin film transistor transmitting the voltage to be applied to the pixel electrode of the display area DA are disposed in the thin film transistor formation region TA.

In an exemplary embodiment of the pixel PX, as shown in FIG. 7, the reference voltage line V is positioned in the longitudinal direction along the center of the display area DA. The reference voltage line V vertically extends while dividing eight domains into two regions, each of which includes four domains. In such an embodiment, the display area DA is divided into three subpixel areas, and includes one high-gray subpixel area H sub and two low-gray subpixel areas L sub.

Figure 10:
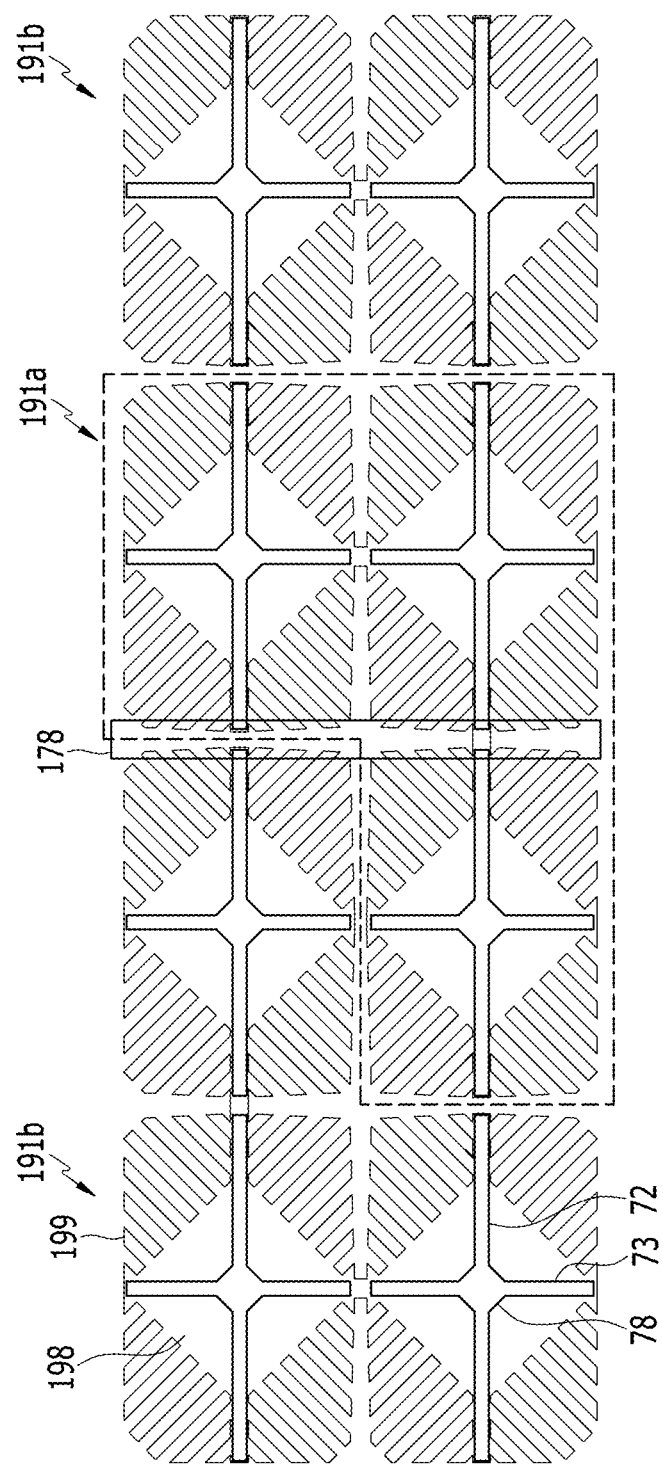
FIG. 10 is a plan view of a pixel electrode and surroundings thereof in another alternative exemplary embodiment of a display device according to the invention.

FIG. 7 does not show positions of the high-gray subpixel area H sub and the two low-gray subpixel areas L sub in the pixel PX. In an exemplary embodiment, the high-gray subpixel area H sub may be positioned at the center and the low-gray subpixel areas L sub may be positioned at sides thereof, but not being limited thereto. In an alternative exemplary embodiment, the positions of the high-gray subpixel area H sub and the two low-gray subpixel areas L sub may be variously modified as shown in FIG. 8 and FIG. 10.

Firstly, an exemplary embodiment shown in FIG. 8 will be described.

Figure 8:
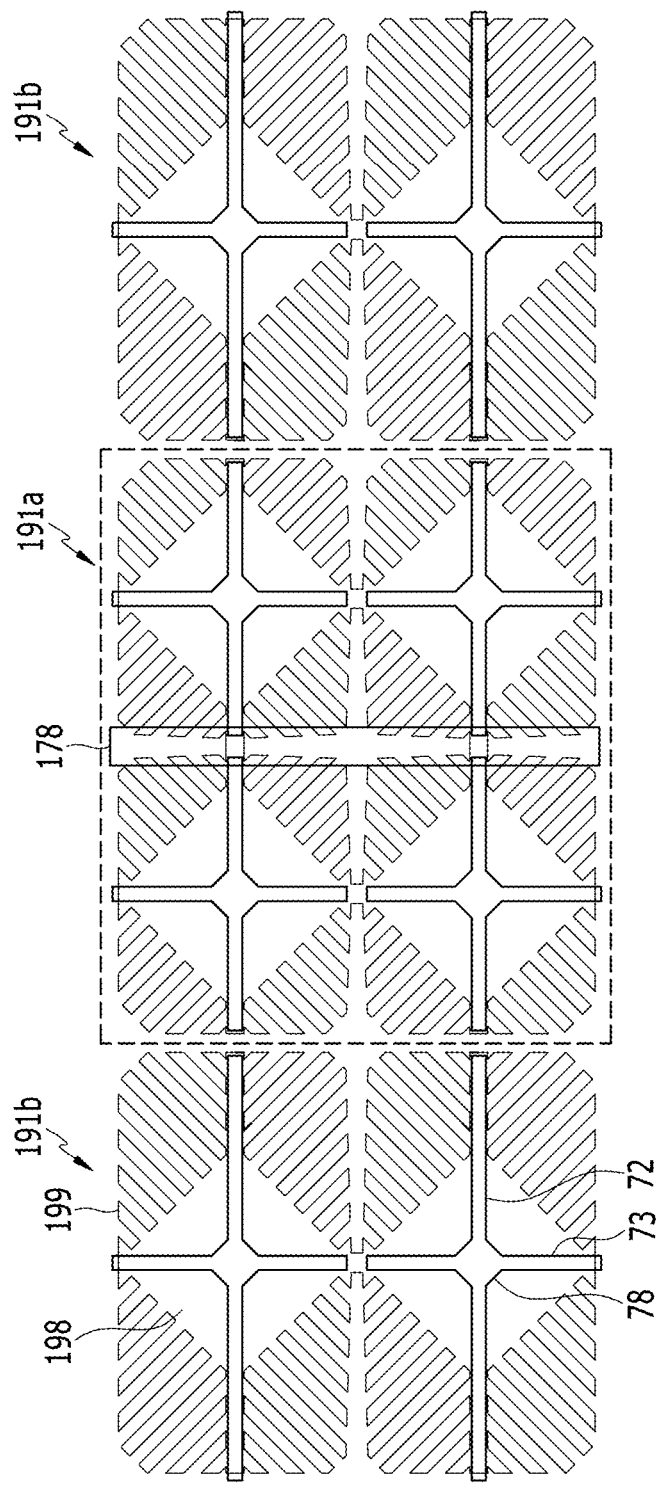
FIG. 8 is a plan view of a pixel electrode and surroundings thereof in an alternative exemplary embodiment of a display device according to the invention.

FIG. 8 is a plan view of a pixel electrode and surroundings thereof in an alternative exemplary embodiment of a display device according to the invention.

In an exemplary embodiment, as shown in FIGS. 7 and 8, four domains among a total of eight domains correspond to the high-gray subpixel area H sub and the remaining four domains among a total of eight domains correspond to two low-gray subpixel areas L sub. In such an embodiment, four domains positioned at the center correspond to the high-gray subpixel area H sub, and two domains in each side portion correspond to the low-gray subpixel areas L sub. Each of the two low-gray subpixel areas L sub are defined by two domains. In such an embodiment, the reference voltage line V crosses the center of the high-gray subpixel area H sub in the longitudinal direction. In FIG. 8, the high-gray pixel electrode included in the high-gray subpixel area H sub is indicated by 191*a*, and the low-gray pixel electrode of the low-gray subpixel area L sub is indicated by 191*b*.

The high-gray subpixel area H sub includes four domains, and each low-gray subpixel area L sub includes two domains. Each domain is indicated by a dotted line in FIG. 7, and the dotted line in FIG. 8 divides the subpixel areas. In such an embodiment, the reference voltage line V is disposed in the vertical direction through the center of the pixel PX while dividing eight domain into half, and one low-gray subpixel area L sub and two domains of the high-gray subpixel area H are positioned at the right side of the reference voltage line V, and the other low-gray subpixel area L sub and the remaining two domains of the high-gray subpixel area H are positioned at the left side of the reference voltage line V. As a result, an image displayed by the pixel PX have a right-left symmetry with reference to the reference voltage line V.

The pixel electrode positioned in the pixel PX includes the high-gray pixel electrode 191*a* as the pixel electrode of the high-gray subpixel and the low-gray pixel electrode 191*b* as the pixel electrode of the low-gray subpixel.

The high-gray pixel electrode 191*a* includes four unit pixel electrodes 198 and 199 corresponding to four domains, respectively, and each of the two low-gray pixel electrodes 191*b* include two unit pixel electrodes 198 and 199. A total number of the unit pixel electrodes 198 and 199 included in two low-gray pixel electrodes 191*b* is 4.

Each unit pixel electrode includes the center electrode 198 and the minute branches 199 extending outwardly from the side of the center electrode 198. The minute branches 199 may form an angle of about 45 degrees with respect to a horizontal direction or a vertical direction, or may form an angle in a range of about 40 degrees to about 50 degrees. Also, one side of the center electrode 198 and the minute branches 199 may be substantially vertical to each other.

The unit pixel electrodes of the high-gray pixel electrode 191*a* and the low-gray pixel electrode 191*b* may be connected to each other through the extension. In an exemplary embodiment, as shown in FIG. 8, the center electrode 198 has a size large enough to contact or define the side of the region where the unit pixel electrode is disposed. In an alternative exemplary embodiment, the size of the center electrode 198 may be decreased, and the minute branches 199 may be positioned at the corner of the center electrode 198 to contact or define the side of the region where the unit pixel electrode is disposed. The extension of the unit pixel electrode extends from the center electrode 198 or the minute branches 199. The unit pixel electrodes connected to each other by the extension are applied with the same voltage. The unit pixel electrodes included in a pixel electrode, e.g., the high-gray pixel electrode 191*a* or the low-gray pixel electrode 191*b*, are connected to each other through the extension, and are separated or spaced apart from the unit pixel electrodes included in the other pixel electrodes, e.g., the low-gray pixel electrode 191*b* or the high-gray pixel electrode 191*a*.

In an exemplary embodiment, openings 72, 73 and 78 are defined in an upper common electrode of one domain region where the unit pixel electrodes 198 and 199 are positioned as domain dividers. In such an embodiment, the opening in the upper common electrode may be a cross-shaped opening including a transverse opening 72, a longitudinal opening 73 crossing the transverse opening 72, and, a center opening 78 positioned at the center of the cross-shaped opening. The center opening 78 may have the polygonal shape including four straight sides respectively positioned at four sub-regions divided by the cross-shaped opening. In one exemplary embodiment, for example, the center opening 78 has a rhombus shape.

In an exemplary embodiment, the openings 72, 73 and 78 corresponding to the adjacent unit pixel electrodes are not connected to each other. In an alternative exemplary embodiment, the adjacent openings 72, 73 and 78 may be connected to each other.

In the structure in which the low-gray pixel electrode 191*b*, the high-gray pixel electrode 191*a*, and the low-gray pixel electrode 191*b* are sequentially arranged, the reference voltage line 178 crosses the center of the high-gray pixel electrode 191*a* positioned at the center of the pixel in the longitudinal direction.

In an exemplary embodiment, as shown in FIG. 8, a size of the unit pixel electrodes 198 and 199, each of which defines a domain, may be different from each other. In such an embodiment, the size of the unit pixel electrodes 198 and 199 included in the low-gray pixel electrode 191*b* may be larger than the size the unit pixel electrodes 198 and 199 included in the high-gray pixel electrode 191*a*. In an exemplary embodiment, in which the high-gray pixel electrode 191a and the low-gray pixel electrode 191b have a different number of unit pixel electrodes, the size of each unit pixel electrodes may be different from each other such that areas occupied by the high-gray pixel electrode 191a and the low-gray pixel electrode 191b may be substantially the same or similar to each other.

The portion where the texture is generated in the pixel having the structure of FIG. 8 will be described with reference to FIG. 9.

Figure 9:
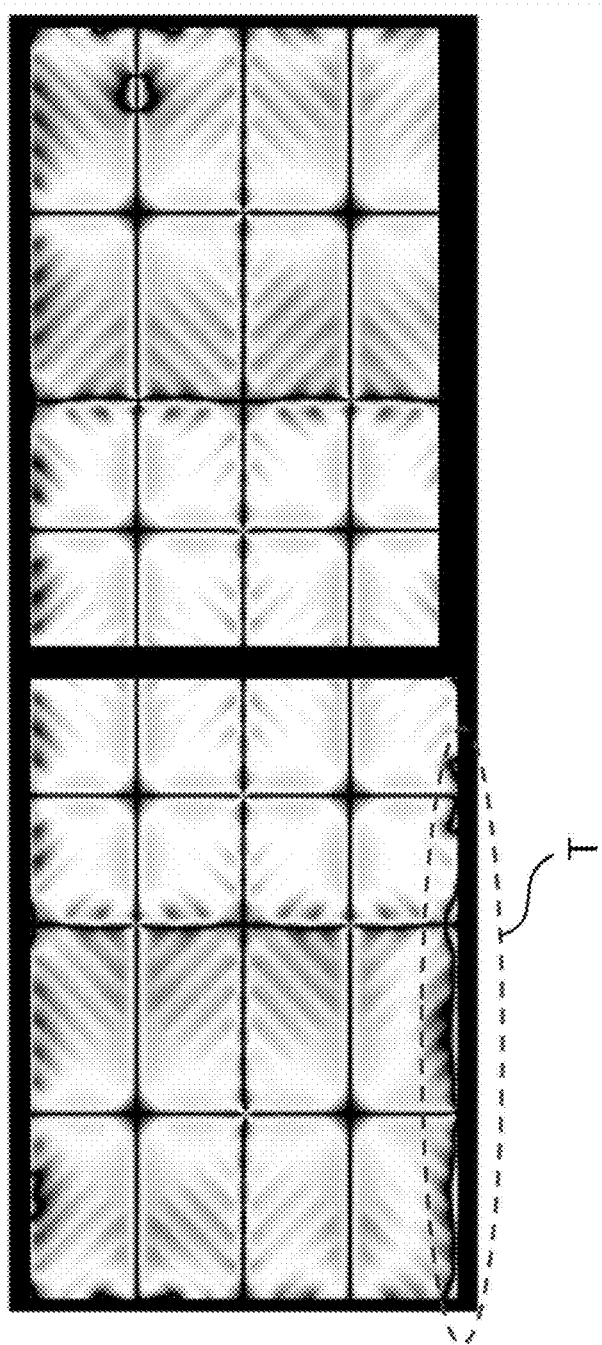
FIG. 9 is a view of texture of an exemplary embodiment of a pixel in a structure of FIG. 8.

FIG. 9 is a view showing texture of an exemplary embodiment of a pixel in a structure of FIG. 8.

In FIG. 9, the texture is shown in the portion indicated by T. This portion is below the low-gray pixel electrode 191b and above the branch 178b of the reference voltage line 178. In general, the texture mainly appears on the circumference (up/down/right/left) of the low-gray pixel electrode 191b. In the pixel structure of an exemplary embodiment of the invention, as shown in FIG. 9, the texture is recognized only under the low-gray pixel electrode 191b closer to the thin film transistor formation region TA among two low-gray pixel electrodes 191b such that the formation of the texture is reduced.

Next, an alternative exemplary embodiment having an asymmetric structure in which the high-gray pixel electrode 191a includes three unit pixel electrodes 198 and 199 will be described with reference to FIG. 10.

FIG. 10 is a plan view of a pixel electrode and surroundings thereof in another alternative exemplary embodiment of a display device according to the invention.

In an exemplary embodiment, as shown in FIG. 10, three domains among a total of eight domains define the high-gray subpixel area H sub, and the remaining five domains defines two low-gray subpixel areas L sub. In such an embodiment, three domains positioned at the center correspond to one high-gray subpixel area H sub, and the remaining five domains positioned at both sides correspond to two low-gray subpixel areas L sub. Each domain is divided by the dotted line in FIG. 7, and the dotted line in FIG. 10 divides the subpixel areas.

In an exemplary embodiment, as shown in FIG. 10, three domains included in the high-gray subpixel area H sub include two domains of a lower row and one domain of an upper row. In such an embodiment, the left low-gray subpixel area L sub includes three domains, and the right low-gray subpixel area L sub includes two domains.

In such an embodiment, the reference voltage line 178 crosses the center of eight domains in the longitudinal direction. The reference voltage line 178 extends while dividing two domains of the lower row among three domains of the high-gray subpixel area H sub. The high-gray subpixel area H sub has an asymmetric structure with respect to the reference voltage line 178, however two low-gray subpixel areas L sub may exist sides (e.g., left and right sides) of the reference voltage line 178, respectively. In such an embodiment, although two low-gray subpixel areas L sub have the asymmetrical structure, the two low-gray subpixel areas L sub are positioned adjacent to only one side of the reference voltage line 178, that is, the low-gray subpixel area L of the left side is spaced apart from the reference voltage line 178.

In FIG. 10, the high-gray pixel electrode included in the high-gray subpixel area H sub is indicated by 191a, and the low-gray pixel electrode of the low-gray subpixel area L sub is indicated by 191b.

The pixel electrode positioned in one pixel PX includes the high-gray pixel electrode 191a as the pixel electrode of the high-gray subpixel and the low-gray pixel electrode 191b as the pixel electrode of the low-gray subpixel.

The high-gray pixel electrode 191a includes three unit pixel electrodes 198 and 199 corresponding to three domains, respectively, and two low-gray pixel electrodes 191b respectively include three and two unit pixel electrodes 198 and 199. The total number of unit pixel electrodes 198 and 199 included in two low-gray pixel electrodes 191b is 5.

Each unit pixel electrode includes the center electrode 198 and the minute branches 199 extending outwardly from the side of the center electrode 198. The minute branches 199 may form an angle of about 45 degrees with respect to a horizontal direction or a vertical direction, or may form an angle in a range of about 40 degrees to about 50 degrees. Also, one side of the center electrode 198 and the minute branches 199 may be substantially vertical to each other.

The unit pixel electrodes of the high-gray pixel electrode 191a and the low-gray pixel electrode 191b may be connected to each other through the extension. In an exemplary embodiment, as shown in FIG. 10, the center electrode 198 has a size large enough to contact or define the side of the region where the unit pixel electrode is disposed. In an alternative exemplary embodiment, the size of the center electrode 198 may be decreased, and the minute branches 199 may be positioned at the corner of the center electrode 198 to contact or define the side of the region where the unit pixel electrode is disposed. The extension of the unit pixel electrode extends from the center electrode 198 or the minute branches 199. The unit pixel electrodes connected by the extension are applied with the same voltage. The unit pixel electrodes included in a pixel electrode, e.g., the high-gray pixel electrode 191a or the low-gray pixel electrode 191b, are connected to each other through the extension, and are separated or spaced apart from the unit pixel electrodes included in the other pixel electrodes, e.g., the low-gray pixel electrode 191b or the high-gray pixel electrode 191a.

In an exemplary embodiment, openings 72, 73 and 78 are defined in an upper common electrode of one domain region where the unit pixel electrodes 198 and 199 are positioned as domain dividers. In an exemplary embodiment, the openings in the upper common electrode may be a cross-shaped opening including a transverse opening 72, a longitudinal opening 73 crossing the transverse opening 72, and a center opening 78 positioned at the center of the cross-shaped opening. The center opening 78 may have the polygonal shape including four straight sides respectively positioned at four sub-regions divided by the cross-shaped opening. In one exemplary embodiment, for example, the center opening 78 has rhombus shape.

In an exemplary embodiment, the openings 72, 73 and 78 corresponding to the adjacent unit pixel electrodes and are not connected to each other. In an alternative exemplary embodiment, the adjacent openings 72, 73, and 78 may be connected to each other.

In the structure in which a low-gray pixel electrode 191b, a high-gray pixel electrode 191a, and a low-gray pixel electrode 191b are sequentially arranged, the reference voltage line 178 crosses the center of the high-gray pixel electrode 191a positioned at the center of the pixel in the longitudinal direction.

The portion where the texture is generated in the pixel having the structure of FIG. 10 will be described with reference to FIG. 11.

Figure 11:
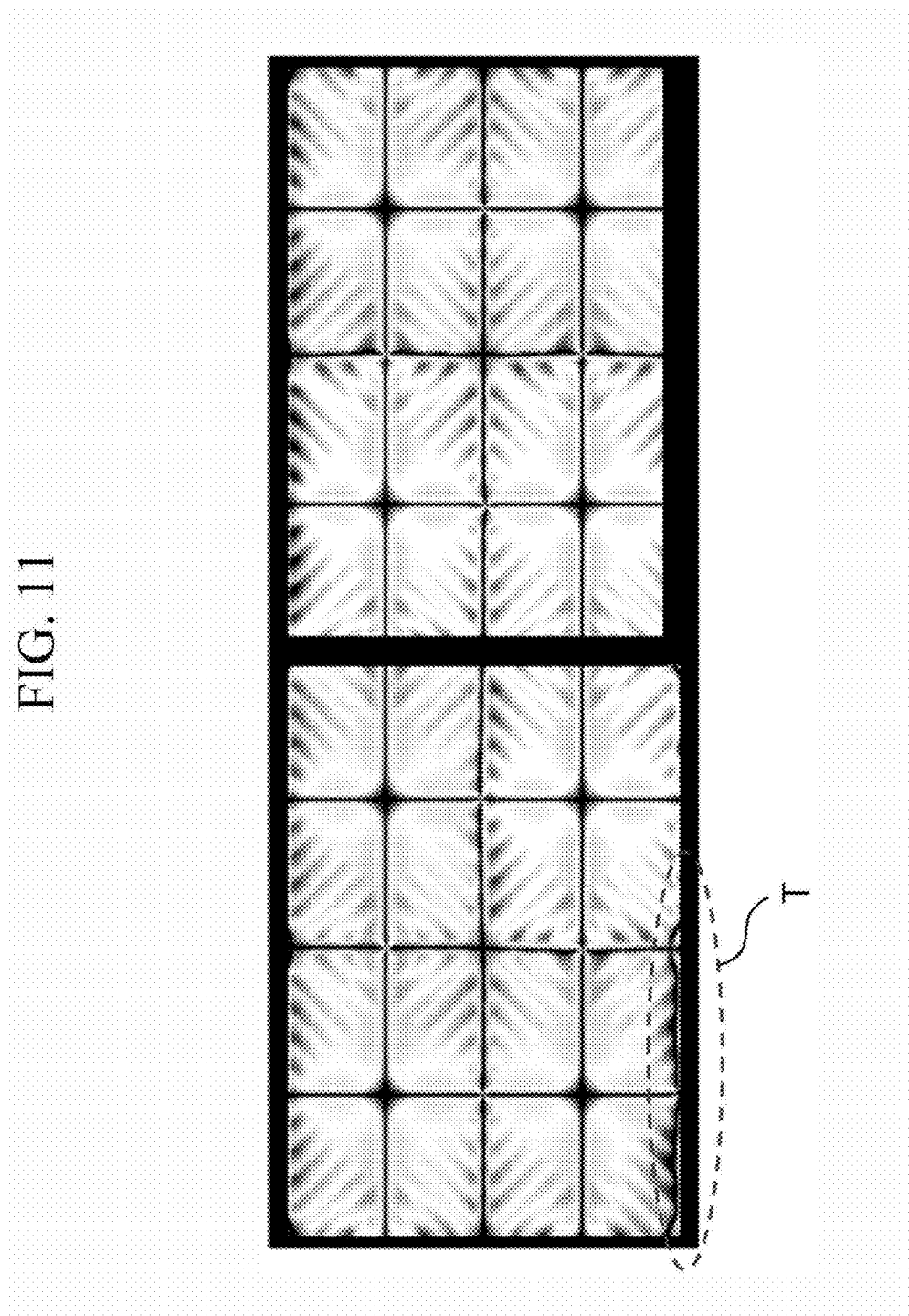
FIG. 11 is a view of texture of an exemplary embodiment of a pixel in a structure of FIG. 10.

FIG. 11 is a view showing texture of an exemplary embodiment of a pixel in a structure of FIG. 10.

In FIG. 11, the texture is shown in the portion indicated by T. This portion is below the low-gray pixel electrode 191b and above the branch 178b of the reference voltage line 178. In general, the texture mainly appears on the circumference (up/down/right/left) of the low-gray pixel electrode 191b. In the pixel structure of an exemplary embodiment of the invention, the texture is recognized only under the low-gray pixel electrode 191b closer to the thin film transistor formation region TA among two low-gray pixel electrodes 191b such that the formation of the texture is reduced.

In an exemplary embodiment of FIG. 10, two unit pixel electrodes among the high-gray pixel electrode 191a are positioned at the lower row. In such an embodiment, where the texture is generated at the lower left region of the pixel PX and near the low-gray pixel electrode 191b, a width of the lower row on the left side is greater than a width of the lower row on the right side such that the size of the texture is further reduced, that is, the size of the texture shown in FIG. 11 may be smaller than the size of the texture shown in FIG. 9.

In the above, the texture generated near the low-gray pixel electrode 191b was described.

Hereinafter, a generation degree of the texture according to the connection structure of the connection 195, in which each unit pixel electrode 198 and 199 is connected to the drain electrode of the thin film transistor, will be described with reference to In FIG. 12 to FIG. 14.

FIG. 12 to FIG. 14 are views of a connection structure of an exemplary embodiment of a pixel electrode according to the invention.

FIG. 12 to FIG. 14 includes a description of the structure of the pixel electrode in photographs.

In an exemplary embodiment, as shown in FIG. 12 and FIG. 13, the connection 195 connected to the unit pixel electrode 198 and 199 has a linear structure. In FIG. 14, a connection 195' connected to the unit pixel electrode 198 and 199 has two bent structure (hereinafter, a dual bent connection 195').

As shown by the texture of FIG. 14 and the texture of FIG. 12, the texture near the connection 195 is substantially decreased in the exemplary embodiment of FIG. 12. That is, the texture is less generated in an embodiment including the connection 195 in a linear structure (hereinafter, a linear connection 195) rather than the dual bent connection 195'.

FIG. 12 and FIG. 13 show embodiments including the linear connection 195 disposed apart from the unit pixel electrode 198 and 199 by different distances, that is, the linear connection 195 includes a bent portion extending from an extending direction thereof toward the unit pixel electrode 198 and 199 to be connected thereto. In FIG. 13, an exemplary embodiment including the linear connection 195 disposed apart from the unit pixel electrode 198 and 199 with a distance longer by about 1 μm than the connection 195 of the exemplary embodiment shown in FIG. 12 in the left side of FIG. 13, and an exemplary embodiment of the linear connection 195 disposed apart from the unit pixel electrode 198 and 199 with a distance longer by about 2 μm than the connection 195 of the exemplary embodiment shown in FIG. 12 is shown in the right side of FIG. 13. Here, a reference distance, with which the connection disposed apart from the unit pixel electrode 198 and 199, that is, the connection 195 of the exemplary embodiment shown in FIG. 12, may be about 6 μm. As shown in FIG. 12 and FIG. 13, as the distance of the connection 195 from the unit pixel electrode 198 and 199 (or the length of the bent end portion of the connection 195) is increased, the texture is decreased while the position of the unit pixel electrode is farther from the boundary of the domain. However, when the unit pixel electrode is positioned substantially inwardly, the region of the liquid crystal molecules that are not effectively controlled is increased. Accordingly, in an exemplary embodiment, the distance of the connection may be increased up to about 2 μm from the reference distance as shown in FIG. 13. In an exemplary embodiment, the distance of the connection 195 from the unit pixel electrode 198 and 199 may be in the range of about 6 μm to about 8 μm, as described above.

Next, another exemplary embodiment of the invention will be described with reference to FIG. 15.

Figure 15:
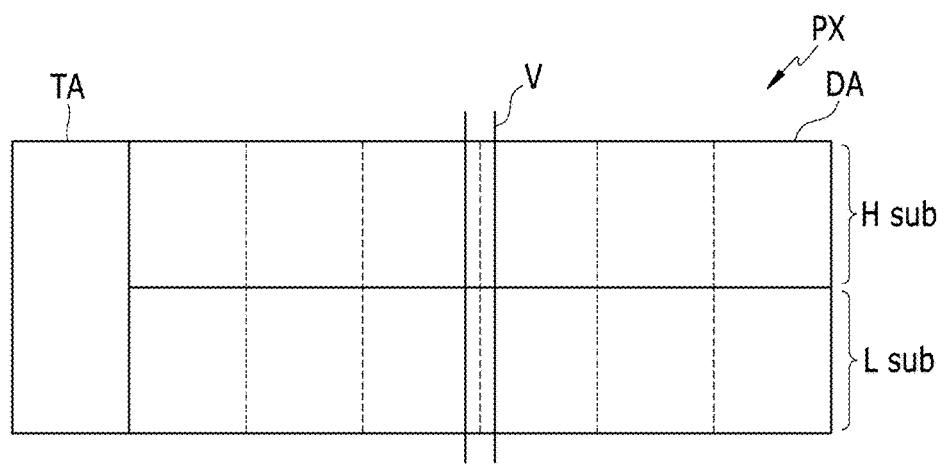
FIG. 15 is a schematic diagram showing an alternative exemplary embodiment of a pixel of a display device according to the invention.

FIG. 15 is a schematic diagram of another alternative exemplary embodiment of a pixel of a display device according to the invention.

In an exemplary embodiment, the pixel PX is the transverse type pixel having a shape elongated substantially in the horizontal direction. In such an embodiment, the pixel PX includes the thin film transistor formation region TA and the display area DA. The pixel electrode is disposed in the display area DA and displays the image through the liquid crystal molecules disposed in the display area DA. In such an embodiment, the element and the wiring such as the thin film transistor that transmits the voltage to be applied to the pixel electrode of the display area DA are disposed in the thin film transistor formation region TA.

In an exemplary embodiment, as shown in FIG. 15, the pixel PX includes the reference voltage line V positioned in the vertical direction at the center of the display area DA. In such an embodiment, the display area DA is divided into two subpixel areas including one high-gray subpixel area H sub and one low-gray subpixel area L sub. The high-gray subpixel area H sub and the low-gray subpixel area L sub extend substantially in the vertical direction. In an exemplary embodiment, as shown in FIG. 15, the high-gray subpixel area H sub is positioned at the upper side in the pixel PX, and the low-gray subpixel area L sub is positioned at the lower side in the pixel PX. As a result, the reference voltage line V crosses the center of the high-gray subpixel area H sub and the low-gray subpixel area L sub in the vertical or the longitudinal direction.

In an exemplary embodiment, each of the subpixel areas H sub and L sub includes six domains. Each domain is divided by the dotted line in FIG. 15, and the solid line indicates the boundary of the high-tray and low-gray subpixel areas H sub and L sub. In such an embodiment, the subpixel areas are divided into upper and lower parts. In an exemplary embodiment, the pixel PX includes twelve domains, and each subpixel area H sub or L sub includes six domains. According to an exemplary embodiment, the pixel PX may be divided into an even-number of domains, e.g., 12. Also, the reference voltage line V is positioned while dividing twelve domains, and the low-gray subpixel area L sub and the high-gray subpixel area H sub are divided into half by the reference voltage line V. As a result, an image display by the pixel may have the right-left symmetry with reference to the reference voltage line V.

The entire structure of the pixel including the pixel electrode, the common electrode and the reference voltage line will be described with reference to FIG. 16.

Figure 16:
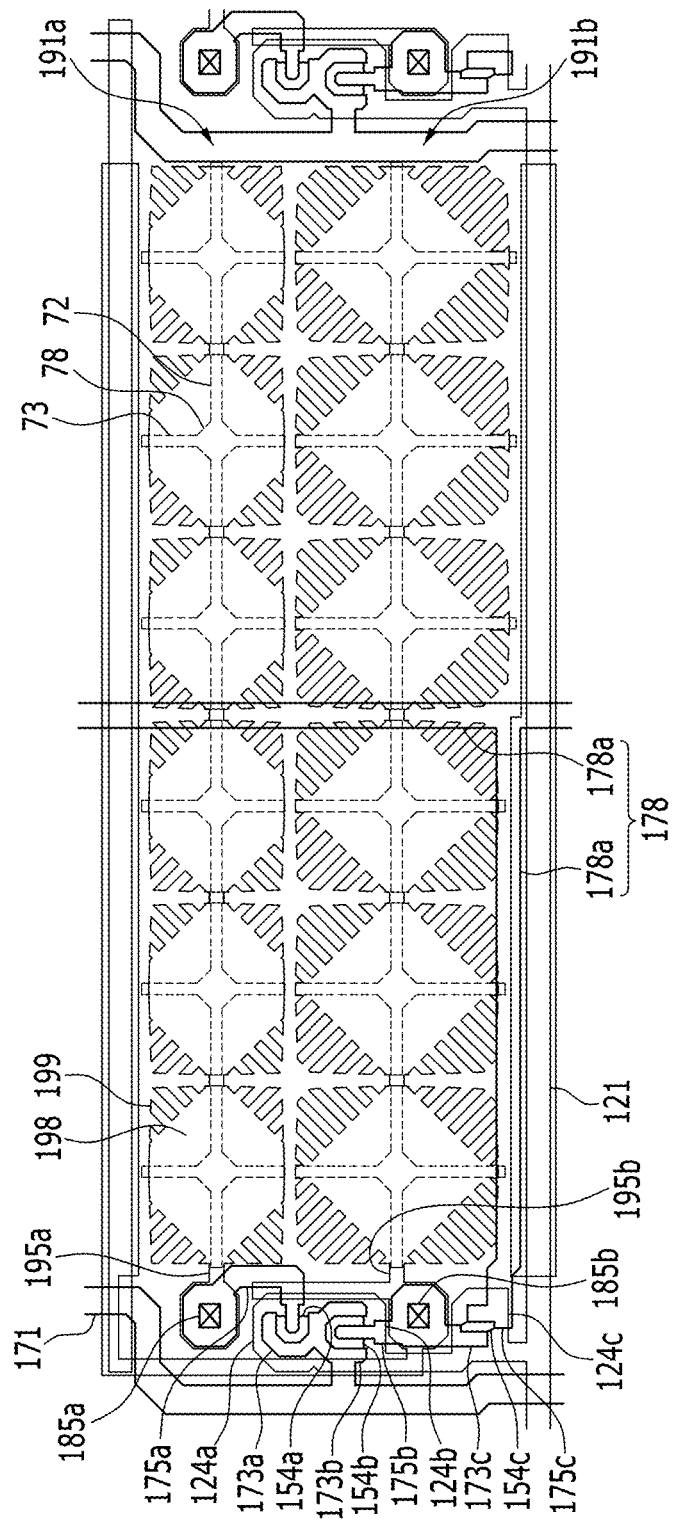
FIG. 16 is a view of a detailed structure of another alternative exemplary embodiment a pixel of FIG. 15.

FIG. 16 is a view of a detailed structure of an exemplary embodiment of a pixel of FIG. 15.

Firstly, referring to the lower panel of the display device, a plurality of gate lines 121 are positioned on an insulation substrate of the lower panel.

The gate line 121 extends substantially in the horizontal or transverse direction and includes a first gate electrode 124a, a second gate electrode 124b and a third gate electrode 124c protruding and extending upwardly from the gate line 121. In such an embodiment, the third gate electrode 124c extends and expands upwardly from the gate line 121, and the first gate electrode 124a and the second gate electrode 124b extend from the third gate electrode 124c. The first gate electrode 124a and the second gate electrode 124b may include an expanded portion. In such an embodiment, the gate line 121 may include a curved portion that is periodically curved from a main line extending substantially in the transverse direction.

A gate insulating layer is disposed on the gate line 121, and a first semiconductor 154a, a second semiconductor 154b and a third semiconductor 154c are respectively disposed on the first gate electrode 124a, the second gate electrode 124b and the third gate electrode 124c thereon.

A data conductor including a data line 171, a first drain electrode 175a, a second drain electrode 175b, a third source electrode 173c, a third drain electrode 175c and a reference voltage line 178 is disposed on the first semiconductor 154a, the second semiconductor 154b, the third semiconductor 154c and the gate insulating layer.

The data line 171 extends substantially in the longitudinal direction, and includes a first source electrode 173a and a second source electrode 173b respectively extending from a main line of the data line 171 toward the first and second gate electrodes 124a and 124b.

The reference voltage line 178 includes a main line 178a extending substantially parallel to the data line 171 and a branch 178b extending from the main line 178a and substantially parallel to the gate line 121. The branch 178b extends to a thin film transistor formation region TA along an outer region of the display area, and one end of the branch 178b defines the third drain electrode 175c.

In such an embodiment, the first drain electrode 175a faces the first source electrode 173a, the second drain electrode 175b faces the second source electrode 173b, and the third drain electrode 175c faces the third source electrode 173c. The third source electrode 173c is connected to the second drain electrode 175b.

The first gate electrode 124a, the first source electrode 173a and the first drain electrode 175a collectively define a first thin film transistor along with the first semiconductor 154a, the second gate electrode 124b, the second source electrode 173b and the second drain electrode 175b collectively define a second thin film transistor along with the second semiconductor 154b, and the third gate electrode 124c, the third source electrode 173c and the third drain electrode 175c collectively define a third thin film transistor along with the third semiconductor 154c. In such an embodiment, the data voltage is applied through the source electrode of the first thin film transistor and the second thin film transistor, and the reference voltage is applied through the source electrode of the third thin film transistor.

A passivation layer is disposed on the data conductor, and a pixel electrode is disposed on the passivation layer.

In such an embodiment, the pixel electrode positioned in a pixel PX includes the high-gray pixel electrode 191a as the pixel electrode of the high-gray subpixel, and the low-gray pixel electrode 191b as the pixel electrode of the low-gray subpixel. The pixel electrode includes one high-gray pixel electrode 191a and one low-gray pixel electrode 191b.

Each of the high-gray pixel electrode 191a and the low-gray pixel electrode 191b include six unit pixel electrodes 198 and 199 corresponding to six domains, and each unit pixel electrode includes the center electrode 198 and the minute branches 199 extending outwardly from the side of the center electrode 198. The minute branches 199 may form an angle of about 45 degrees with respect to a horizontal direction or a vertical direction, or may form an angle in a range of about 40 degrees to about 50 degrees. Also, one side of the center electrode 198 and the minute branches 199 may be substantially vertical to each other.

Six unit pixel electrodes of the high-gray pixel electrode 191a or the low-gray pixel electrode 191b are arranged in the vertical direction with a line and are connected through the extension. In an exemplary embodiment of FIG. 16, the center electrode 198 has a size large enough to contact or define the side of the region where the unit pixel electrode is disposed, but not being limited thereto. In an alternative exemplary embodiment, the size of the center electrode 198 may be decreased, and the minute branches 199 may be positioned at the corner of the center electrode 198. The extension of the unit pixel electrode extends from the center electrode 198 or the minute branches 199. Six unit pixel electrodes connected by the extension are applied with the same voltage. The unit pixel electrodes included in one of the high-gray pixel electrode 191a and the low-gray pixel electrode 191b are connected to each other through the extension, and are separated or spaced apart from the unit pixel electrodes included in the other of the high-gray pixel electrode 191a and the low-gray pixel electrode 191b.

The first drain electrode 175a of the first thin film transistor is connected to the high-gray pixel electrode 191a through the first contact hole 185a. In an exemplary embodiment, as shown in FIG. 16, the first connection 195a extends in the left side to be connected to the high-gray pixel electrode 191a.

The second drain electrode 175b of the second thin film transistor is connected to the low-gray pixel electrode 191b through the second contact hole 195b. In an exemplary embodiment, as shown in FIG. 16, the low-gray pixel electrode 191b is connected through the second connection 195b, and the second connection 195b extends in the left side to be connected to the low-gray pixel electrode 191b. The third thin film transistor connects the second drain electrode 175b of the second thin film transistor and the reference voltage line 178 to change the level of the data voltage applied to the low-gray pixel electrode 191b.

Next, referring to the upper panel of the display device, a common electrode that faces the pixel electrode and receives a common voltage is disposed on an insulation substrate of the upper panel.

In an exemplary embodiment, openings 72, 73 and 78 may be defined in an upper common electrode of one domain region where the unit pixel electrodes 198 and 199 are positioned as a domain divider. In such an embodiment, the openings in the upper common electrode may be a cross-shaped opening including a transverse opening 72, a longitudinal opening 73 crossing the transverse opening 72, and, a center opening 78 positioned at the center of the cross-shaped opening may be further included. The center opening 78 may have the polygonal shape including four straight sides respectively positioned at four sub-regions divided by the cross-shaped opening. In one exemplary embodiment, for example, the center opening 78 has a rhombus shape.

In an exemplary embodiment, the openings 72, 73, and 78 corresponding to the adjacent unit pixel electrodes are not connected to each other. In an alternative exemplary embodiment, the adjacent openings 72, 73 and 78 may be connected to each other.

According to an exemplary embodiment, the common electrode may include a protrusion as the domain divider.

A liquid crystal layer interposed between the lower panel and the upper panel includes liquid crystal molecules having negative dielectric anisotropy. The liquid crystal molecules may be aligned such that longitudinal axes thereof are disposed substantially perpendicular to the upper and lower display panels when an electric field is not generated therein.

When the data voltage is transmitted to the pixel PX, the data voltage is applied to the high-gray pixel electrode 191a through the first thin film transistor as it is. In such an embodiment, the low-gray pixel electrode 191b is applied with a middle voltage between the data voltage applied through the second thin film transistor and the reference voltage through the third thin film transistor. As a result, the high-gray pixel electrode 191a and the low-gray pixel electrode 191b are applied with the voltages having different levels.

The high-gray and low-gray pixel electrodes 191a and 191b applied with the data voltages of the different levels generate an electric field along with a common electrode of the upper panel such that the orientation of the liquid crystal molecules of the liquid crystal layer between two electrodes is determined. When the orientation of the liquid crystal molecules of the liquid crystal layer between two electrodes is determined, the inclination direction of the liquid crystal molecules may be firstly determined by a horizontal component generated by a gap where the pixel electrode is not positioned, and the side of the opening of the common electrode that distorts the main electric field substantially vertical to the surface of the display panel. The horizontal component of the main electric field is almost perpendicular to the side of the unit pixel electrode 198 and 199 and the openings 72, 73, and 78, and the liquid crystal molecules are inclined in the direction substantially perpendicular to the sides thereof.

In the structure in which the high-gray pixel electrode 191a and the low-gray pixel electrode 191b are arranged in the upper and lower portions of the pixel, respectively, the reference voltage line 178 crosses the center of the high-gray pixel electrode 191a and the low-gray pixel electrode 191b in the vertical direction, thereby having the symmetrical structure.

A portion where a texture is generated in the pixel having the structure of FIG. 16 will be described with reference to FIG. 17.

Figure 17:
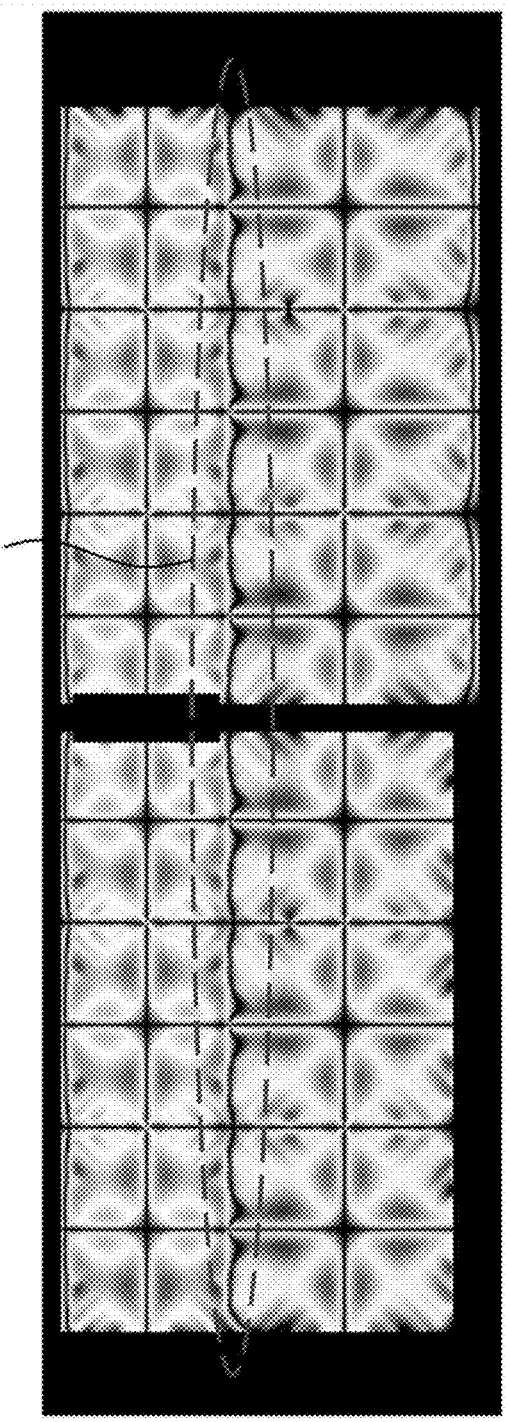
FIG. 17 is a view of texture of an exemplary embodiment of a pixel in a structure of FIG. 16.

FIG. 17 is a view showing texture of an exemplary embodiment a pixel in a structure of FIG. 16.

In FIG. 17, the texture is shown in the portion indicated by T. As shown in FIG. 17, the texture is generated in the portion T between the high-gray pixel electrode 191a and the low-gray pixel electrode 191b.

In an exemplary embodiment of the pixel having the structure of FIG. 16, the texture is generated between the high-gray pixel electrode 191a and the low-gray pixel electrode 191b, and in such an embodiment, the texture near the outer of the pixel is decreased.

Hereinafter, the texture generated between the high-gray pixel electrode 191a and the low-gray pixel electrode 191b shown in FIG. 17 will be described in greater detail with reference to FIG. 18.

Figure 18:
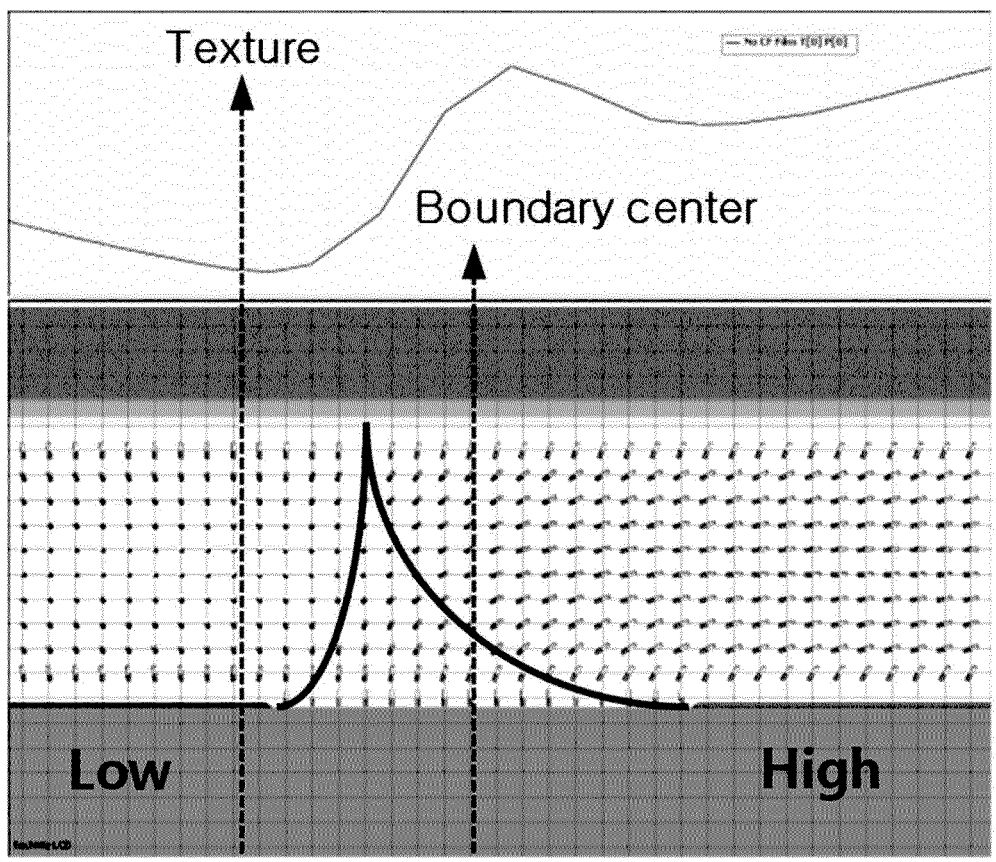
FIG. 18 is a cross-sectional view of a position where texture is generated according to an electric field in an exemplary embodiment of a liquid crystal display according to the invention.

FIG. 18 is a cross-sectional view of a position where texture is generated according to an electric field in an exemplary embodiment of a liquid crystal display according to the invention.

In FIG. 18, 'High' means that the high voltage is relatively applied to the side of the high-gray pixel electrode 191a. In FIG. 18, low' means that the low voltage is relatively applied to the side of the low-gray pixel electrode 191b.

The liquid crystal molecules are arranged by the high voltage applied to the high-gray pixel electrode 191a on the high-gray pixel electrode 191a and are relatively arranged by the low voltage on the low-gray pixel electrode 191b. However, in the center of two pixel electrodes, the arrangement direction of the liquid crystal molecule arranged on the high-gray pixel electrode 191a and the arrangement direction of the liquid crystal molecules arranged on the low-gray pixel electrode 191b may contact or collide to each other. However, the arrangement direction on the high-gray pixel electrode 191a applied with the high voltage has a stronger control force such that the texture is generated at the position closer to the low-gray pixel electrode 191b, not the middle position of two electrodes as shown in FIG. 18.

According to an exemplary embodiment having a pixel structure of FIG. 16, the texture generated near the pixel electrode may be reduced.

Hereinafter, exemplary embodiments in which the texture generated at the center shown in FIG. 17 is reduced will be described in greater detail with reference to FIG. 19 to FIG. 22.

FIG. 19 to FIG. 22 are views of texture of exemplary embodiments of a pixel electrode having various structures, according to the invention.

In the upper side of each of FIG. 19 to FIG. 22, an exemplary embodiment of the unit pixel electrode included in the high-gray pixel electrode 191a and the unit pixel electrode of the low-gray pixel electrode 191b are shown. Also, in the lower side of each of FIG. 19 to FIG. 22, the texture of the unit pixel is shown.

In FIG. 19 to FIG. 22, the change of the texture is shown while changing the interval between the high-gray pixel electrode 191a and the low-gray pixel electrode 191b in the pixel.

Firstly, in an exemplary embodiment, as shown in FIG. 19, the interval between the unit pixel electrode included in the high-gray pixel electrode 191a and the unit pixel electrode of the low-gray pixel electrode 191b may be substantially uniform. That is, the distance in the vertical direction between any parts of the unit pixel electrode is substantially constant.

Figure 20:
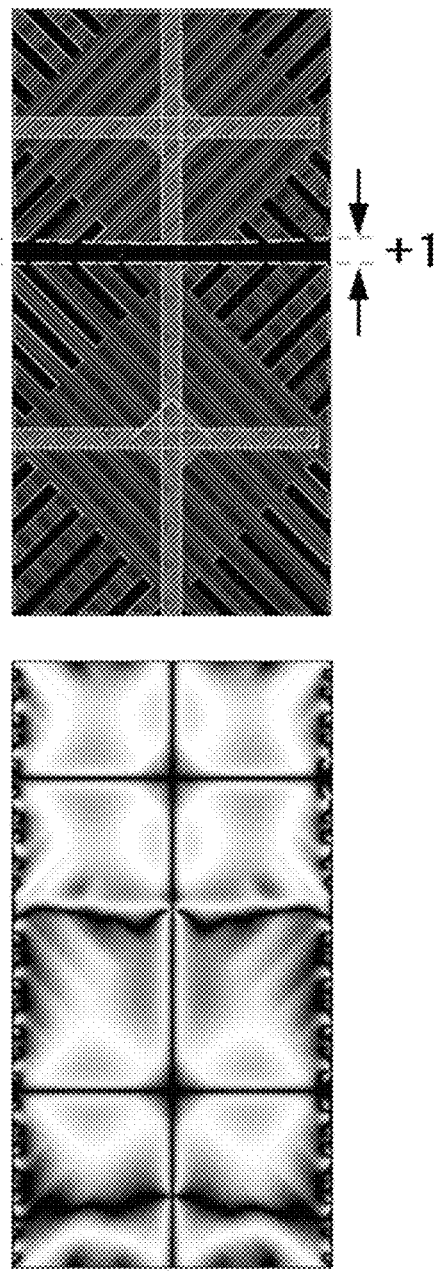
Figure 21:
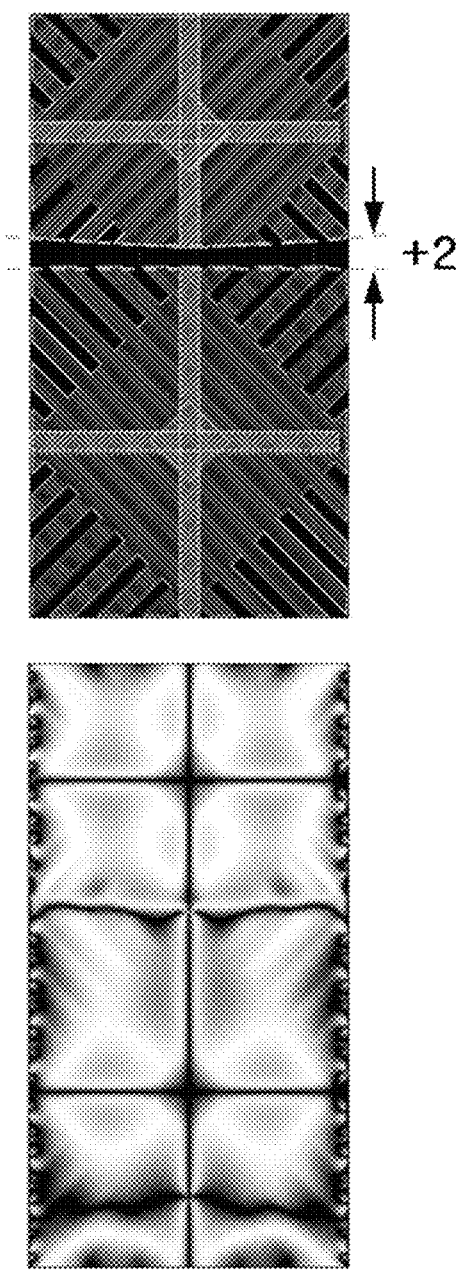
Figure 22:
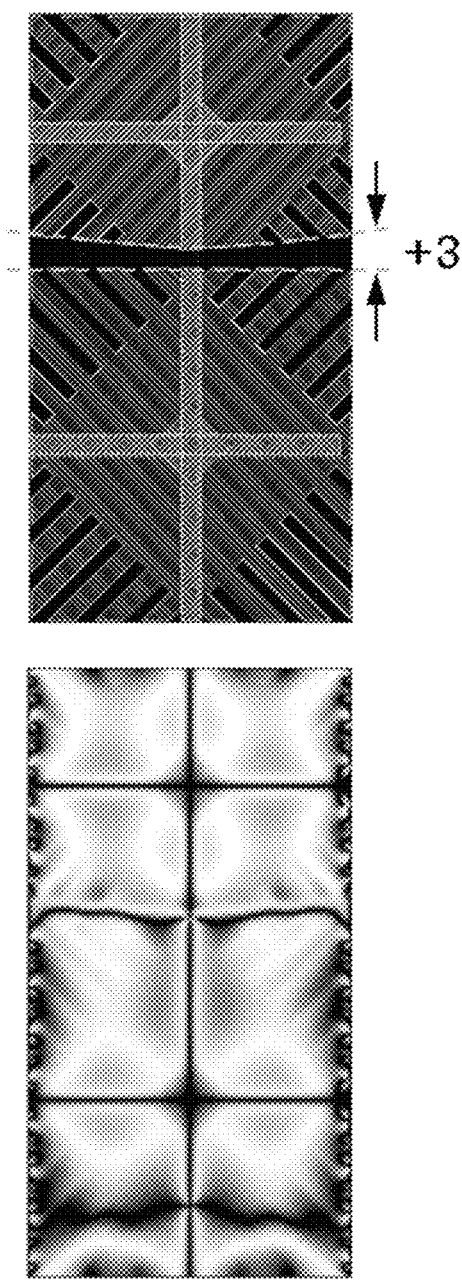

In alternative exemplary embodiment, as shown in FIG. 20 to FIG. 22, the distance between two unit pixel electrodes in the vertical direction may increase as being closer to both ends from the center, that is, in a direction away from the center of the display area toward a side of the display area. FIG. 20 shows an exemplary embodiment in which the distance of the vertical direction between two unit pixel electrodes at both ends of the display area is longer than the distance of the vertical direction between two unit pixel electrodes in the middle portion or the center of the display area, that is, the reference distance, by about 1 μm, FIG. 21 shows an exemplary embodiment in which the distance of the vertical direction between two unit pixel electrodes at both ends is longer than the reference distance by about 2 μm, and FIG. 22 shows an exemplary embodiment in which the distance of the vertical direction between two unit pixel electrodes at both ends is longer than the reference distance by about 3 μm.

As shown in the texture at the lower side of FIG. 19 to FIG. 22, the texture is generated smallest in the exemplary embodiment of FIG. 22. Accordingly, in an exemplary embodiment, at least one unit pixel electrode of the unit pixel electrode of the high-gray pixel electrode 191a and the unit pixel electrode of the low-gray pixel electrode 191b has the quadrangular structure, and one of facing sides of the unit pixel electrode of the high-gray pixel electrode 191a and the unit pixel electrode of the low-gray pixel electrode 191*b* may have a curved line structure or may be a convex side. In such an embodiment, when the curvature of the convex side becomes greater, the texture may be decreased. A distance or height difference between the center and both ends of the convex side may be in a range of about zero (0) μm to about 3 μm.

In an exemplary embodiment, the high-gray pixel electrode and the low-gray pixel electrode may have the different voltage levels by using the reference voltage line 178, as described above.

Next, an exemplary embodiment, in which the voltage levels of two subpixel electrodes are changed, will be described with reference to the circuit diagrams of FIG. 23 to FIG. 27.

FIG. 23 to FIG. 27 are equivalent circuit diagrams of exemplary embodiments of a pixel according to the invention.

Firstly, a pixel of an exemplary embodiment of the liquid crystal display will be described with reference to FIG. 12.

Figure 23:
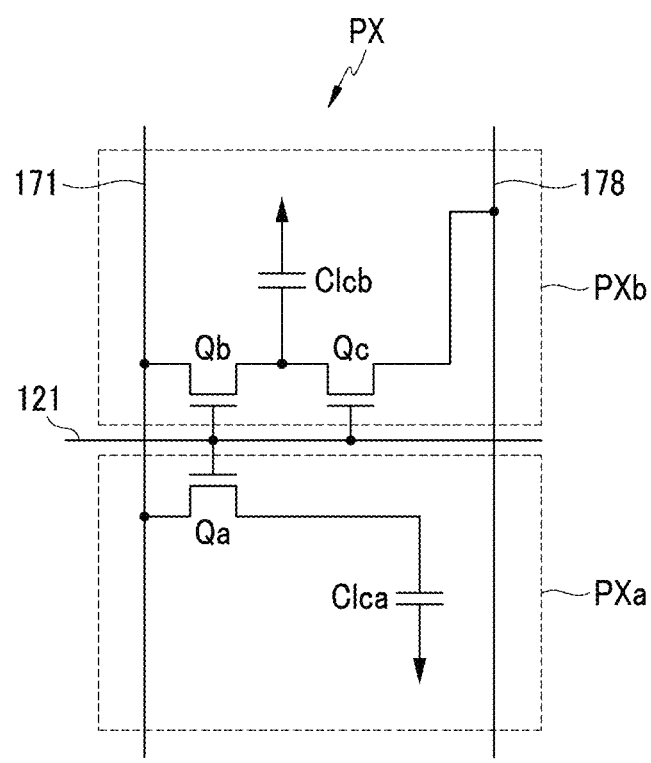
FIG. 23 to FIG. 27 are equivalent circuit diagrams showing exemplary embodiments of a pixel according to the invention.

FIG. 23 is a circuit diagram of an exemplary embodiment of the pixel in which the voltages of the different levels are applied to two subpixel electrodes by using the reference voltage line 178, as described above.

In FIG. 23, the high-gray subpixel is indicated by PXa and the low-gray subpixel is indicated by PXb.

Referring to FIG. 23, an exemplary embodiment of the liquid crystal display according to the invention includes the signal lines such as the gate line 121, the data line 171 and the reference voltage line 178 that transmits the reference voltage, and the pixels PX connected to the signal lines.

Each pixel PX includes the first and second subpixels PXa and PXb. The first subpixel PXa includes a first switching element Qa and a first liquid crystal capacitor Clca, and the second subpixel PXb includes second and third switching elements Qb and Qc and a second liquid crystal capacitor Clcb. The first and second thin film transistors Qa and Qb are respectively connected to the gate line 121 and the data line 171, and the third thin film transistor Qc is connected to an output terminal of the second switching element Qb and the reference voltage line 178. An output terminal of the first switching element Qa is connected to the first liquid crystal capacitor Clca, and the output terminal of the second switching element Qb is connected to input terminals of the second liquid crystal capacitor Clcb and the third switching element Qc. The third switching element Qc includes a control terminal connected to the gate line 121, an input terminal connected to the second liquid crystal capacitor Clcb, and an output terminal connected to the reference voltage line 178.

Referring to the operation of the pixel PX shown in FIG. 23, firstly, when the gate line 121 is applied with the gate-on voltage, the first switching element Qa, the second switching element Qb and the third switching element Qc connected to the gate line 121 are turned on. Accordingly, the data voltage applied to the data line 171 is applied to the first liquid crystal capacitor Clca and the second liquid crystal capacitor Clcb through the turned-on first and second switching elements Qa and Qb such that the first liquid crystal capacitor Clca and the second liquid crystal capacitor Clcb are charged by the difference between the data voltage and the common voltage. When the first liquid crystal capacitor Clcb and the second liquid crystal capacitor Clcb are equally applied with the data voltage through the first and second switching elements Qa and Qb, the charging voltage of the second liquid crystal capacitor Clcb is divided through the third switching element Qc. Accordingly, the charging voltage of the second liquid crystal capacitor Clcb is less than the charging voltage of the first liquid crystal capacitor Clca such that the luminances of the two subpixels PXa and PXb may be different from each other. Accordingly, by properly controlling the voltage charged in the first liquid crystal capacitor Clca and the voltage charged in the second liquid crystal capacitor Clcb, an image viewed from the side may be substantially close to an image viewed from the front, thereby improving side visibility.

However, the structure of the pixel PX of an exemplary embodiment of the liquid crystal display according to the invention is not limited to the exemplary embodiment shown in FIG. 23, and may be variously modified.

Figure 24:
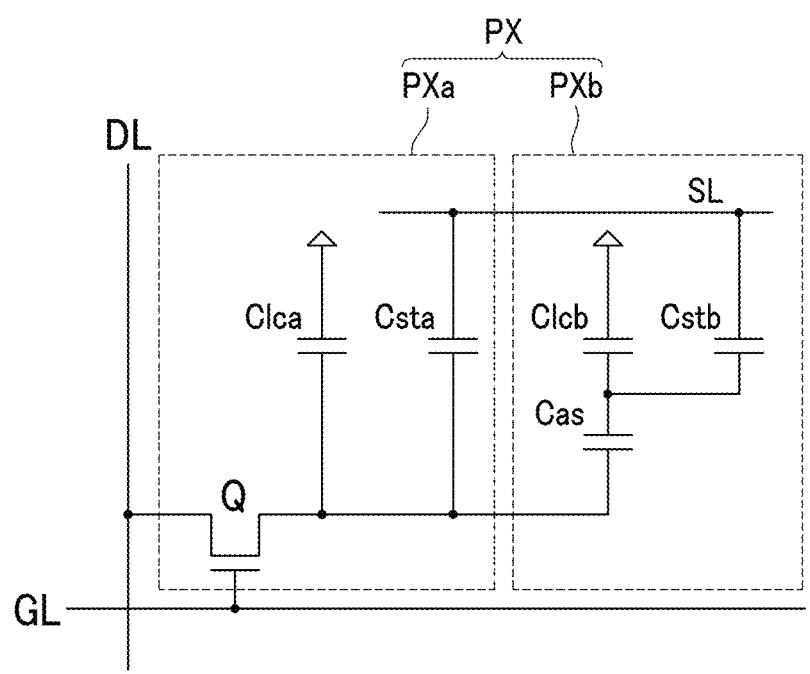

Next, a pixel of an alternative exemplary embodiment of the liquid crystal display will be described with reference to FIG. 24.

Such an embodiment of the liquid crystal display according to the invention includes signal lines including a plurality of gate lines GL, a plurality of data lines DL and a plurality of storage electrode lines SL, and a plurality of pixels PX connected thereto. Each pixel PX includes a pair of first and second subpixels PXa and PXb. The first subpixel electrode 191*a* is disposed in the first subpixel PXa and the second subpixel electrode 191*b* is disposed in the second subpixel PXb.

In such an embodiment, each pixel of the liquid crystal display may further include a switching element Q connected to a gate line GL and a data line DL, a first liquid crystal capacitor Clca and a first storage capacitor Csta that are connected to the switching element Q and disposed in the first subpixel PXa, and a second liquid crystal capacitor Clcb and a second storage capacitor Cstb that are connected to the switching element Q and disposed in the second subpixel PXb, and an auxiliary capacitor Cas disposed between the switching element Q and the second liquid crystal capacitor Clcb.

In such an embodiment, the switching element Q, which is a three-terminal element such as a thin film transistor and the like and disposed in the lower display panel, includes a control terminal connected to the gate line GL, an input terminal connected to the data line DL, and an output terminal connected to the first liquid crystal capacitor Clca, the first storage capacitor Csta and the auxiliary capacitor Cas.

One terminal of the auxiliary capacitor Cas is connected to an output terminal of the switching element Q, and the other terminal of the auxiliary capacitor Cas is connected to the second liquid crystal capacitor Clcb and the second storage capacitor Cstb.

The charged voltage of the second liquid crystal capacitor Clcb is lower than the charged voltage of the first liquid crystal capacitor Clca by the auxiliary capacitor Cas, thereby improving the side visibility of the liquid crystal display.

Figure 25:
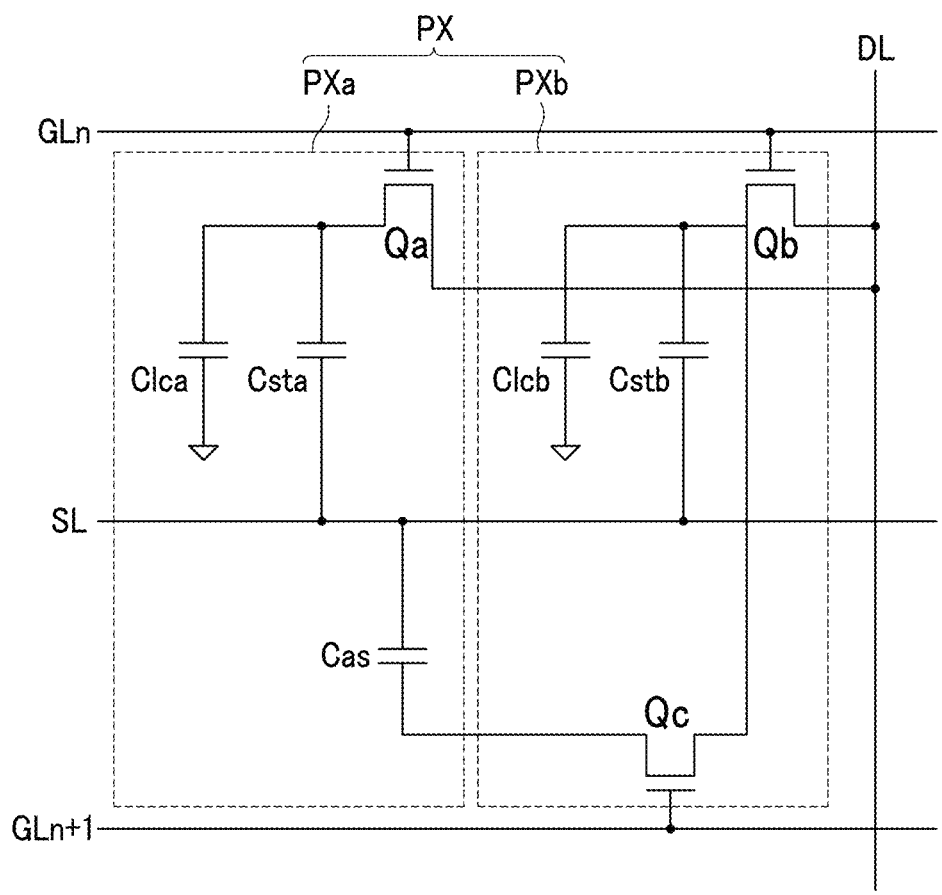

Next, a pixel of another alternative exemplary embodiment of the liquid crystal display will be described with reference to FIG. 25.

In such an embodiment, the liquid crystal display includes signal lines including a plurality of gate lines GLn and GL(n+1), a plurality of data lines DL and a plurality of storage electrode lines SL, and a plurality of pixels PX connected thereto. Each pixel PX includes a pair of first and second subpixels PXa and PXb. The first subpixel electrode 191*a* is disposed in the first subpixel PXa and the second subpixel electrode 191*b* is disposed in the second subpixel PXb.

In such an embodiment, the liquid crystal display may further include a first switching element Qa and a second switching element Qb that are connected to a gate line GLn and a data line DL, a first liquid crystal capacitor Clca and a first storage capacitor Csta that are connected to the first switching element Qa and formed in the first subpixel PX, a second liquid crystal capacitor Clcb and a second storage capacitor Cstb that are connected to the second switching element Qb and disposed in the second subpixel, a third switching element Qc connected to the second switching element Qb and a subsequent gate line GL(n+1), and an auxiliary capacitor Cas connected to the third switching element Qc.

The first and second switching elements Qa and Qb, which are three-terminal elements such as a thin film transistor, etc. and disposed in a lower display panel, include control terminals connected to the gate line GLn, input terminals connected to the data line DL, and output terminals connected to the first liquid crystal capacitor Clca and the first storage capacitor Csta, and the second liquid crystal capacitor Clcb and the second storage capacitor Cstb, respectively.

The third switching element Qc, which is a three-terminal element such as a thin film transistor and the like and disposed in the lower display panel, includes a control terminal connected to the subsequent gate line GL(n+1), an input terminal connected to the second liquid crystal capacitor Clcb, and an output terminal connected to the auxiliary capacitor Cas.

One terminal of the auxiliary capacitor Cas is connected to the output terminal of the third switching element Qc, and the other terminal is connected to a storage electrode line SL.

Hereinafter, an operation of such an embodiment of the liquid crystal display will be described. When a gate-on voltage is applied to the gate line GLn, the first and second switching elements Qa and Qb that are connected to the gate line GLn are turned on, and a data voltage of the data line 171 is applied to the first and second subpixel electrodes through the turned-on first and second switching elements Qa and Qb.

Subsequently, when a gate-off voltage is applied to the gate line GLn and the gate-on voltage is applied to the subsequent gate line GL(n+1), the first and second switching elements Qa and Qb are turned off and the third switching element Qc is turned on. As a result, electrical charges of the second subpixel electrode (191b of FIG. 6) connected to the output terminal of the second switching element Qb flow into the auxiliary capacitor Cas such that the voltage of the second liquid crystal capacitor Clcb is decreased.

As described above, in such an embodiment, the charged voltages of the first and second liquid crystal capacitors Clca and Clcb are different from each other, thereby improving the side visibility of the liquid crystal display.

Figure 26:
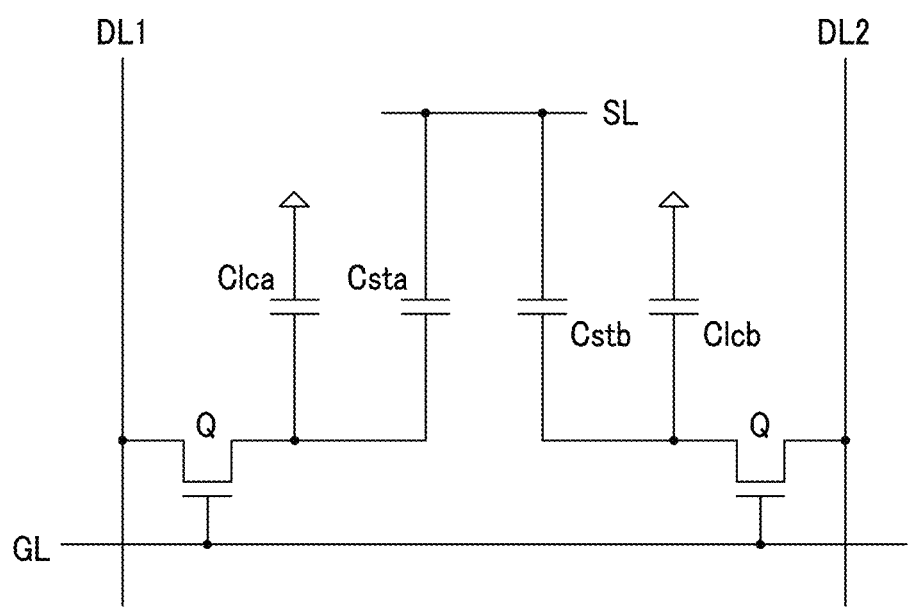

Next, a pixel of another alternative exemplary embodiment of the liquid crystal display will be described with reference to FIG. 26.

An exemplary embodiment of the liquid crystal display according to the invention includes the signal lines such as a plurality of gate lines GL, a plurality of data lines DL1 and DL2, and a plurality of storage electrode lines SL, and a plurality of pixels PX connected thereto. Each pixel PX includes a pair of first and second liquid crystal capacitors Clca and Clab and a pair of first and second storage capacitors Csta and Cstb.

In such an embodiment, each subpixel of the pixel PX includes one liquid crystal capacitor and one storage capacitor in addition to one thin film transistor Q. The thin film transistors Q of two subpixels included in one pixel are connected to the gate lines GL, and connected to different data lines (e.g., two adjacent data lines) DL1 and DL2, respectively. The different data lines DL1 and DL2 simultaneously apply the voltages of the different levels such that the first and second liquid crystal capacitors Clca and Clcb of two subpixels have different charged voltages. As a result, in such an embodiment, the lateral visibility of the liquid crystal display may be improved.

Next, a pixel of another alternative exemplary embodiment of the liquid crystal display will be described with reference to FIG. 27.

Figure 27:
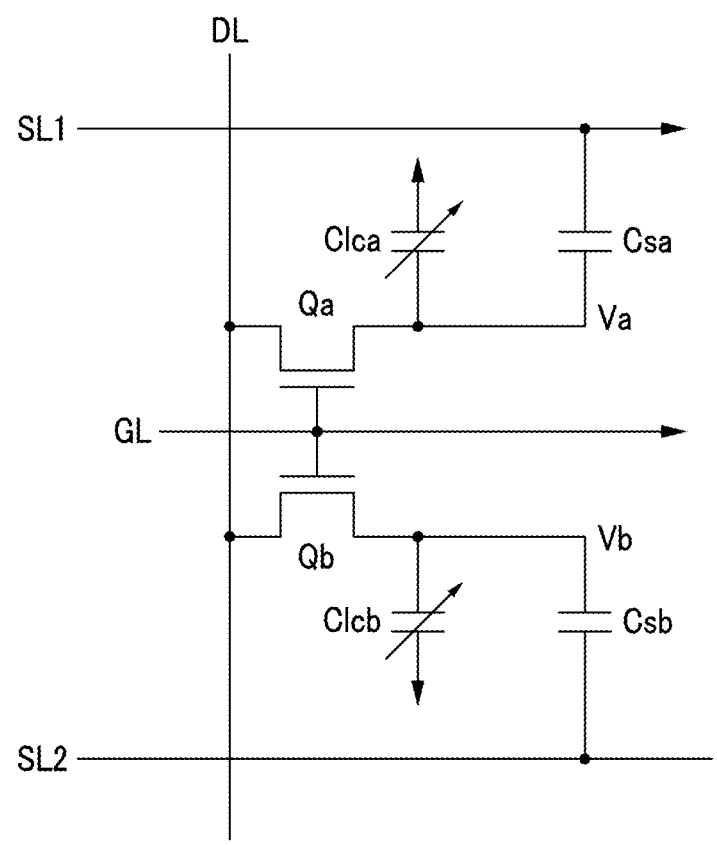

In an exemplary embodiment, as shown in FIG. 27, the liquid crystal display includes the gate line GL, the data line DL, a first power line SL1, a second power line SL2, and the first and second switching elements Qa and Qb connected to the gate line GL and the data line DL.

In such an embodiment, the liquid crystal display further includes an assistance step-up capacitor Csa and the first liquid crystal capacitor Clca connected to the first switching element Qa, and an assistance step-down capacitor Csb and the second liquid crystal capacitor Clcb connected to the second switching element Qb.

The first switching element Qa and the second switching element Qb may be the three-terminal elements such as the thin film transistor. The first switching element Qa and the second switching element Qb are connected to the same gate line GL and the same data line DL to be turned on such that the same data signals are output thereto at the same time.

A voltage that swings in a constant period is applied to the first power line SL1 and the second power line SL2. The first power line SL1 is applied with a first low voltage during a predetermined period or a first period (for example, a horizontal period), and is applied with a first high voltage during a next predetermined period or a second period. The second power line SL2 is applied with a second high voltage during the predetermined period or the first period, and is applied with a second low voltage during the next predetermined period or the second period. In such an embodiment, the first period and the second period are set repeatedly (e.g., alternately or several times) during one frame, such that the voltage that swings is applied to the first power line SL1 and the second power line SL2. In such an embodiment, the first low voltage and the second low voltage may be substantially the same as each other, and the first high voltage and the second high voltage may be substantially the same as each other.

The assistance step-up capacitor Csa is connected to the first switching element Qa and the first power line SL1, and the assistance step-down capacitor Csb is connected to the second switching element Qb and the second power line SL2.

A voltage Va of a terminal (hereinafter referred to as a "first terminal") through which the assistance step-up capacitor Csa is connected to the first switching element Qa is decreased when the first power line SL1 is applied with the first low voltage, and the voltage Va of the first terminal is increased when the first power line SL1 is applied with the first high voltage. Then, the voltage Va of the first terminal swings according to the swing of the voltage of the first power line SL1.

In such an embodiment, a voltage Vb of a terminal (hereinafter referred to as a "second terminal") through which the assistance step-down capacitor Csb is connected to the first switching element Qb is increased when the second power line SL2 is applied with the second high voltage, and the voltage Vb of the second terminal is decreased when the second power line SL2 is applied with the second low voltage. Then, the voltage Vb of the second terminal swings according to the swing of the voltage of the second power line SL2.

As described above, in an exemplary embodiment, two subpixels are applied with the same data voltage, and the voltages Va and Vb of the pixel electrodes of two subpixels becomes different from each other according to the magnitude of the voltages swung in the first and second power lines SL1 and SL2 such that the transmittance of the two subpixels is set differently from each other, thereby improving the lateral visibility.

In an exemplary embodiment, as shown in FIG. 24 to FIG. 27, the reference voltage line is used, but not being limited thereto. In an exemplary embodiment of the invention, any line parallel to the data line and passing the center of the display area of the pixel in the longitudinal direction may be used to improve the display quality.

In exemplary embodiments of the liquid crystal display, the unit pixel electrode included in the pixel electrode has the minute branches 199 and the number of the unit pixel electrodes is substantially great such that the number of the minute branches 199 in the pixel electrode is substantially great. As a result, in such embodiments, the liquid crystal control force to control the liquid crystal molecule may be sufficiently obtained such that a prepolymer polymerized by a separate light may be omitted in the liquid crystal layer.

However, according to an alternative exemplary embodiment, the liquid crystal control force may be partially decreased such that the prepolymer may be included in the liquid crystal layer.

An exemplary embodiment of a method of forming the pretilt in a liquid crystal layer including the prepolymer will be described with reference to FIG. 28.

Figure 28:
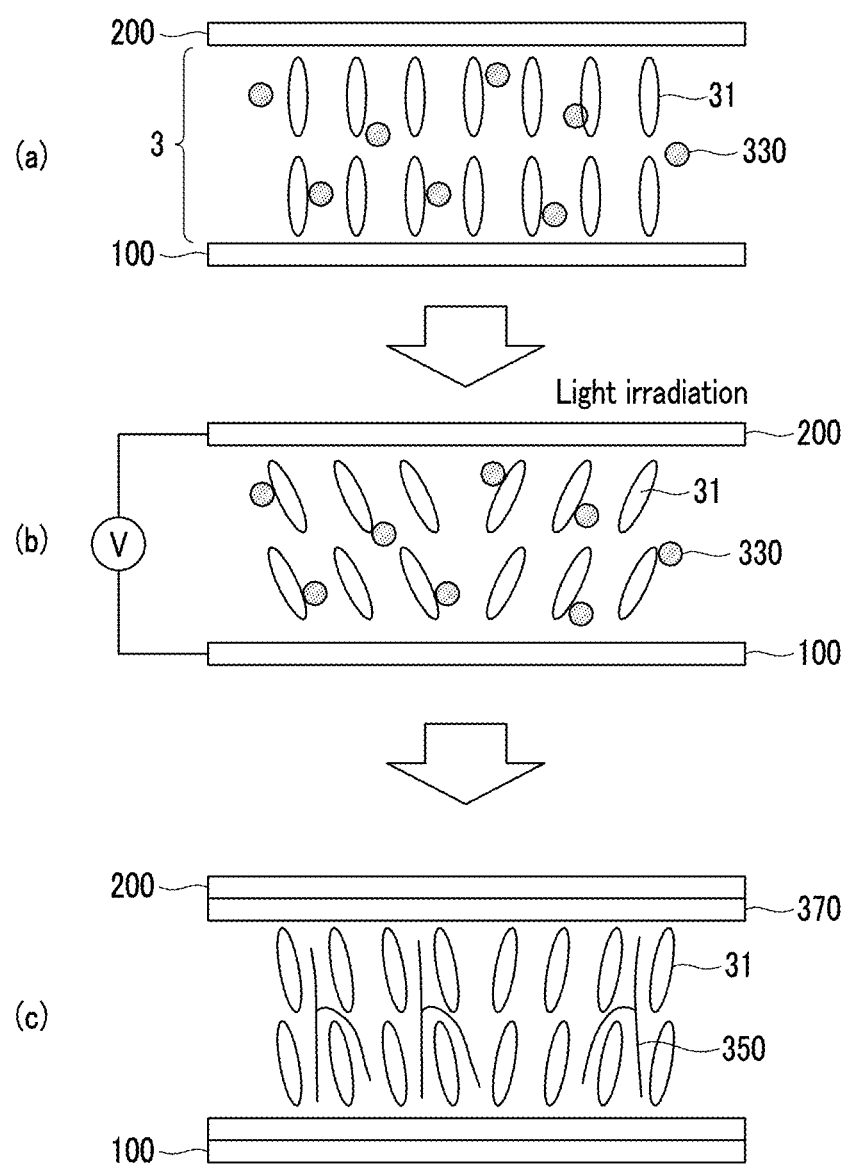
FIG. 28 is a view showing an exemplary embodiment of a process of providing a pretilt angle to liquid crystal molecules using prepolymers that are polarized by light such as ultraviolet rays.

FIG. 28 is a view showing an exemplary embodiment of a process of providing a pretilt angle to liquid crystal molecules using prepolymers polarized by light such as ultraviolet rays.

Referring to FIG. 28, first, prepolymers 330 such as monomers, which is cured by polymerization by rays such as ultraviolet rays, and liquid crystal materials are injected together between two display panels, e.g., a lower panel 100 and an upper panel 200, of a liquid crystal display. The prepolymer 330 may be a reactive mesogen that is polymerized by rays such as ultraviolet rays.

Next, the data voltage is applied to the first and second subpixel electrodes, and a common voltage is applied to the common electrode of the upper panel 200, thereby generating the electric field in a liquid crystal layer 3 between the two display panels 100 and 200. Thus, the liquid crystal molecules 31 of the liquid crystal layer 3 are inclined in a predetermined direction in response to the electric field.

As described above, when light, e.g., the ultraviolet rays, is irradiated in the state that the liquid crystal molecules 31 of the liquid crystal layer 3 are inclined in the predetermined direction, the prepolymer 330 is polymerized, and as shown in FIG. 28, a pretilt providing polymer 350 is formed. The pretilt providing polymer 350 contacts the two display panels 100 and 200. The liquid crystal molecules 31 are determined to have the alignment direction in the above-described direction with the pretilt angle by the pretilt providing polymer 350. Accordingly, in the state that the voltage is not applied to the field generating electrodes, e.g., the pixel electrode and the common electrode, the liquid crystal molecules 31 are arranged with the pretilt angle in four directions.

As a result, the liquid crystal molecules 31 have the pretilt angle in four directions in each region of the upper and lower subpixels in a pixel.

In an exemplary embodiment, the pretilt using the polymer as shown in FIG. 28 is additionally applied such that the texture may be further reduced together with the control by the liquid crystal control force provided by the minute branches 199.

In an exemplary embodiment, as described with reference to FIG. 28, the liquid crystal layer includes the photo-reactive material, but not being limited thereto. In an alternative exemplary embodiment, the alignment layer may include the photo-reactive material.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
   an insulation substrate;
   a plurality of pixels formed on the insulation substrate, wherein each pixel has a shape elongated in a horizontal direction and comprises a thin film transistor formation region and a display area; and
   a reference voltage line extending in a vertical direction along a center of the display area,
   wherein
   the display area comprises a plurality of domains arranged in two rows,
   the domains in a first row of the two rows define a high-gray subpixel area of the display area, the domains in a second row of the two rows define a low-gray subpixel area of the display area, and
   the reference voltage line comprises a branch extending toward the thin film transistor formation region along an outer region of the display area.

2. The liquid crystal display of claim 1, further comprising:
   a first thin film transistor connected to a high-gray pixel electrode disposed in the high-gray subpixel area;
   a second thin film transistor connected to a low-gray pixel electrode disposed in the low-gray subpixel area; and
   a third thin film transistor connected to the low-gray pixel electrode and the reference voltage line.

3. The liquid crystal display of claim 2, wherein
   each of the high-gray subpixel area and the low-gray subpixel area comprises six domains.

4. The liquid crystal display of claim 3, wherein
   the reference voltage line crosses a center of the high-gray subpixel area and the low-gray subpixel area.

5. The liquid crystal display of claim 2, wherein
   the high-gray pixel electrode comprises a plurality of unit pixel electrodes corresponding to the domains in the high-gray pixel area,
   the low-gray pixel electrode comprises a plurality of unit pixel electrodes corresponding to the domains in the low-gray pixel area,
   one of the unit pixel electrodes of the high-gray pixel electrode in the high-gray subpixel area and one of the unit pixel electrodes of the low-gray pixel electrode in the low-gray subpixel area are disposed adjacent to each other in the vertical direction, and a distance between the unit pixel electrodes disposed adjacent to each other in the vertical direction is uniform.

6. The liquid crystal display of claim 2, wherein
the high-gray pixel electrode comprises a plurality of unit pixel electrodes corresponding to the domains in the high-gray pixel area,
the low-gray pixel electrode comprises a plurality of unit pixel electrodes corresponding to the domains in the low-gray pixel area,
one of the unit pixel electrodes of the high-gray pixel electrode in the high-gray subpixel area and one of the unit pixel electrodes of the low-gray pixel electrode in the low-gray subpixel area are disposed adjacent to each other in the vertical direction, and
a distance between the unit pixel electrodes disposed adjacent to each other in the vertical direction increases in a direction away from the center of the display area toward a side of the display area.

7. The liquid crystal display of claim 6, wherein
a difference between the distance between the unit pixel electrodes disposed adjacent to each other in the vertical direction at the center of the display area and the distance between the unit pixel electrodes disposed adjacent to each other in the vertical direction at the side of the display area is in a range of about zero (0) micrometer to about 3 micrometers.

8. The liquid crystal display of claim 2, wherein
each of the high-gray pixel electrode and the low-gray pixel electrode comprises a plurality of unit pixel electrodes,
each of the unit pixel electrodes comprise a center electrode having a plane shape and a plurality of minute branches extending from a side of the center electrode,
each of the high-gray subpixel area and the low-gray subpixel area comprises a common electrode facing the unit pixel electrodes thereof, and
an opening is defined in the common electrode.

* * * * *